US012696490B2

(12) United States Patent
Huang et al.

(10) Patent No.: US 12,696,490 B2
(45) Date of Patent: Jul. 28, 2026

(54) SEMICONDUCTOR SUBSTRATE MANUFACTURING METHOD AND SEMICONDUCTOR SUBSTRATE

(71) Applicant: BOE Technology Group Co., Ltd., Beijing (CN)

(72) Inventors: Jie Huang, Beijing (CN); Ce Ning, Beijing (CN); Zhengliang Li, Beijing (CN); Hehe Hu, Beijing (CN); Jiayu He, Beijing (CN); Nianqi Yao, Beijing (CN); Kun Zhao, Beijing (CN); Feng Qu, Beijing (CN); Xiaochun Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 828 days.

(21) Appl. No.: 17/782,035

(22) PCT Filed: May 27, 2021

(86) PCT No.: PCT/CN2021/096474
§ 371 (c)(1),
(2) Date: Jun. 2, 2022

(87) PCT Pub. No.: WO2021/258983
PCT Pub. Date: Dec. 30, 2021

(65) Prior Publication Data
US 2023/0006070 A1      Jan. 5, 2023

(30) Foreign Application Priority Data
Jun. 24, 2020    (CN) ......................... 202010591840.5

(51) Int. Cl.
*H10D 30/67*        (2025.01)
*H10D 86/01*        (2025.01)
(Continued)

(52) U.S. Cl.
CPC ..... *H10D 30/6757* (2025.01); *H10D 30/6713* (2025.01); *H10D 30/6755* (2025.01);
(Continued)

(58) Field of Classification Search
CPC ........... H10D 30/6757; H10D 30/6713; H10D 30/6755; H10D 30/751; H10D 86/0221;
(Continued)

(56) References Cited

U.S. PATENT DOCUMENTS 5,962,896 A    10/1999  Yabuta et al.
7,981,720 B2    7/2011  Kim et al.
(Continued)

FOREIGN PATENT DOCUMENTS

CN        101626036 A      1/2010
CN        101908489 A     12/2010
(Continued)

OTHER PUBLICATIONS

Sep. 25, 2024—(US) Final Office Action U.S. Appl. No. 17/763,297.
(Continued)

*Primary Examiner* — Sitaramarao S Yechuri
(74) *Attorney, Agent, or Firm* — Banner & Witcoff, Ltd.

(57) ABSTRACT

A semiconductor substrate manufacturing method and a semiconductor substrate. The manufacturing method includes: forming a first semiconductor layer on the base substrate at a first temperature with a first oxide semiconductor material; forming the second semiconductor layer directly on the first semiconductor layer with a second oxide semiconductor material; and performing a patterning process such that the first semiconductor layer and the second semiconductor layer are respectively patterned into a seed layer and a first channel layer. Both the first oxide semiconductor material and the second oxide semiconductor material are capable of forming crystalline phases at a second
(Continued)

temperature, the second temperature is less than or equal to 40° C., and the first temperature is greater than or equal to 100° C.

16 Claims, 13 Drawing Sheets

(51) Int. Cl.
| | |
|---|---|
| *H10D 86/40* | (2025.01) |
| *H10D 86/60* | (2025.01) |
| *H10D 99/00* | (2025.01) |

(52) U.S. Cl.
CPC ....... *H10D 86/0221* (2025.01); *H10D 86/423* (2025.01); *H10D 86/60* (2025.01); *H10D 99/00* (2025.01)

(58) Field of Classification Search
CPC .. H10D 86/423; H10D 86/60; H10D 86/0229; H10D 99/00
See application file for complete search history.

(56) References Cited

U.S. PATENT DOCUMENTS

| | | | |
|---|---|---|---|
| 8,193,535 | B2 | 6/2012 | Ha et al. |
| 8,530,285 | B2 | 9/2013 | Yamazaki et al. |
| 9,337,344 | B2 | 5/2016 | Hanaoka |
| 9,362,313 | B2 | 6/2016 | Morita et al. |
| 9,773,917 | B2 | 9/2017 | Chen et al. |
| 10,811,444 | B2 | 10/2020 | Jiang |
| 2005/0250270 | A1 | 11/2005 | Wu et al. |
| 2006/0134437 | A1 | 6/2006 | Lee et al. |
| 2008/0038882 | A1 | 2/2008 | Takechi et al. |
| 2011/0140096 | A1 | 6/2011 | Kim et al. |
| 2011/0156026 | A1 | 6/2011 | Yamazaki et al. |
| 2011/0315980 | A1 | 12/2011 | Kim |
| 2012/0097965 | A1 | 4/2012 | Shin et al. |
| 2013/0280859 | A1 | 10/2013 | Kim et al. |
| 2014/0034945 | A1 | 2/2014 | Tokunaga et al. |
| 2015/0115264 | A1 | 4/2015 | Kato |
| 2015/0123127 | A1 | 5/2015 | Yamazaki |
| 2015/0155362 | A1 | 6/2015 | Nakazawa et al. |
| 2015/0179442 | A1 | 6/2015 | Lee et al. |
| 2015/0179446 | A1* | 6/2015 | Lee ...................... H10D 99/00 438/104 |
| 2018/0033858 | A1 | 2/2018 | Moon et al. |
| 2018/0277574 | A1 | 9/2018 | Ochi et al. |
| 2019/0051758 | A1 | 2/2019 | Ochi et al. |
| 2019/0097059 | A1 | 3/2019 | Kikuchi et al. |
| 2019/0280126 | A1 | 9/2019 | Kikuchi et al. |
| 2019/0326443 | A1 | 10/2019 | Suzuki et al. |
| 2020/0027993 | A1 | 1/2020 | Xu et al. |
| 2020/0287054 | A1 | 9/2020 | Suzuki et al. |
| 2021/0083126 | A1 | 3/2021 | Xu et al. |
| 2023/0006070 | A1 | 1/2023 | Huang et al. |
| 2023/0015871 | A1 | 1/2023 | Huang et al. |

FOREIGN PATENT DOCUMENTS

| | | | | |
|---|---|---|---|---|
| CN | 103996717 | A | 8/2014 | |
| CN | 104733512 | A * | 6/2015 | ......... H10D 30/6704 |
| CN | 105190902 | A | 12/2015 | |
| CN | 105633170 | A | 6/2016 | |
| CN | 107146816 | A | 9/2017 | |
| CN | 107749422 | A | 3/2018 | |
| CN | 107978607 | A | 5/2018 | |
| CN | 108780817 | A | 11/2018 | |
| CN | 110718468 | A | 1/2020 | |
| KR | 1020190068058 | A | 6/2019 | |
| WO | 2017153882 | A1 | 9/2017 | |

OTHER PUBLICATIONS

Jun. 18, 2024—(US) Non-Final Office Action U.S. Appl. No. 17/763,297.

Jul. 14, 2023—(EP) Extended European Search Report Appn 21830070. 5.

Lu, et al., "A Bottom-Gate Indium-Gallium-Zinc Oxide Thin-Film Transistor with an Inherent Etch-Stop and Annealing-Induced Source and Drain Regions", IEEE Transactions on Electron Devices, vol. 62, No. 2, Feb. 2015.

Dec. 30, 2024—(IN) Hearing Notice Application No. IN202317002280.

* cited by examiner

100

1403-1    1403-2

1401

SEMICONDUCTOR SUBSTRATE MANUFACTURING METHOD AND SEMICONDUCTOR SUBSTRATE

The application is a U.S. National Phase Entry of International Application PCT/CN2021/096474 filed on May 27, 2021, designating the United States of America and claiming priority to Chinese Patent Application No. 202010591840.5, filed on Jun. 24, 2020. The present application claims priority to and the benefit of the above-identified applications and the above-identified applications are incorporated by reference herein in their entirety.

TECHNICAL FIELD

The embodiments of the present disclosure relate to a manufacturing method of a semiconductor substrate and a semiconductor substrate.

BACKGROUND

Amorphous semiconductor materials are widely used in display technical driving devices. For example, amorphous silicon thin film transistors play a leading role in the display semiconductor substrate backplanes due to their simple process, good device uniformity and low temperature process, etc. Oxide semiconductor thin film transistors that using amorphous oxide semiconductors (such as amorphous indium-gallium-zinc-oxide (a-IGZO) and amorphous indium-zinc-oxide (a-IZO)) as channels are expected to replace amorphous silicon thin film transistors and serve as mainstream display driving devices, due to the advantages (such as high channel mobility, good large-area uniformity and visible light stability, etc.) of the oxide semiconductor thin film transistors.

SUMMARY

At least some embodiments of the disclosure provide a manufacturing method of a semiconductor substrate, comprising: providing a base substrate; forming a semiconductor stack layer comprising a first semiconductor layer, a second semiconductor layer and a third semiconductor layer on the base substrate by a physical vapor deposition process, comprising: forming the first semiconductor layer at an interface on the base substrate with the base substrate at a first temperature, wherein a material of the first semiconductor layer is a first oxide semiconductor material; forming the second semiconductor layer directly on the first semiconductor layer, wherein a material of the second semiconductor layer is a second oxide semiconductor material; and forming the third semiconductor layer, wherein a material of the third semiconductor layer is a third oxide semiconductor material; performing a patterning process on the semiconductor stack layer, such that the first semiconductor layer, the second semiconductor layer and the third semiconductor layer are respectively patterned into a seed layer, a first channel layer and a second channel layer, wherein the seed layer, the first channel layer and the second channel layer constitute a channel stack layer; forming a gate electrode and a gate insulating layer on the base substrate; and forming a source electrode and a drain electrode on the base substrate formed with the channel stack layer, wherein the source electrode and the drain electrode are electrically connected to the channel stack layer, wherein the second channel layer is located between the gate electrode and the first channel layer, the first oxide semiconductor material is different from the third oxide semiconductor material, and the first channel layer and the seed layer are crystalline phase layers, wherein both the first oxide semiconductor material and the second oxide semiconductor material are capable of forming crystalline phases at a second temperature, the second temperature is less than or equal to 40° C., and the first temperature is greater than or equal to 100° C.

In some embodiments, the gate electrode is located between the channel stack layer and the base substrate, and the interface is a surface of the third semiconductor layer away from the base substrate.

In some embodiments, the manufacturing method further comprises: forming an insulating layer on the base substrate, wherein the insulating layer is located between the first semiconductor layer and the base substrate, the channel stack layer is located between the gate electrode and the base substrate, and the interface is a surface of the insulating layer away from the base substrate.

In some embodiments, the channel stack layer has a bottom surface facing the base substrate and a side surface, both the bottom surface and the side surface are planar surfaces, and a first included angle between the bottom surface and the side surface is 20° to 70°.

In some embodiments, the channel stack layer has a bottom surface facing the base substrate and a side surface, the side surface comprises a first sub-side surface and a second sub-side surface, all of the bottom surface, the first sub-side surface and the second sub-side surface are planar surfaces, a second included angle between the bottom surface and the first sub-side surface is 50° to 80°, a third included angle between the second sub-side surface and the bottom surface is 20° to 70°, and the second included angle is different from the third included angle.

In some embodiments, the third semiconductor layer is an amorphous phase layer.

In some embodiments, an electron mobility of the third semiconductor layer is greater than electron mobilities of the first semiconductor layer and the second semiconductor layer.

In some embodiments, a thickness of the second semiconductor layer is four to eight times of a thickness of the first semiconductor layer.

In some embodiments, a band gap $Eg1$ of the second channel layer, a band gap $Eg2$ of the seed layer and a band gap $Eg3$ of the first channel layer satisfy: $Eg1 < Eg2 \leq Eg3$; a conduction band bottom energy level $Ec1$ of the second channel layer, a conduction band bottom energy level $Ec2$ of the seed layer and a conduction band bottom energy level $Ec3$ of the first channel layer satisfy: $|Ec1| > |Ec2| \geq |Ec3|$; a valence band top energy level $Ev1$ of the second channel layer, a valence band top energy level $Ev2$ of the seed layer and a valence band top energy level $Ev3$ of the first channel layer satisfy: $|Ev1| < |Ev2| \leq |Ev3|$.

In some embodiments, a thickness of the seed layer is 50 angstroms to 100 angstroms.

In some embodiments, the first temperature is greater than 120° C.

In some embodiments, the first oxide semiconductor material of the first semiconductor layer is the same as the second oxide semiconductor material of the second semiconductor layer, and the second semiconductor layer is formed at the second temperature.

In some embodiments, each of the first oxide semiconductor material and the second oxide semiconductor material comprises two or more metal elements selected from the group consisting of In, Ga, Zn and Sn.

In some embodiments, each of the first oxide semiconductor material and the second oxide semiconductor material is IGZO material, wherein a ratio of an atomic number of In to a sum of atomic numbers of In, Ga and Zn is 7%-14%; a ratio of an atomic number of Ga to a sum of atomic numbers of In, Ga and Zn is 20%-40%; a ratio of an atomic number of Zn to a sum of atomic numbers of In, Ga and Zn is 50%-70%.

In some embodiments, each of the first oxide semiconductor material and the second oxide semiconductor material is IGZO material, wherein a ratio of an atomic number of In to a sum of atomic numbers of In, Ga and Zn is 35%-50%; a ratio of an atomic number of Ga to a sum of atomic numbers of In, Ga and Zn is 10%-40%; a ratio of an atomic number of Zn to a sum of atomic numbers of In, Ga and Zn is 20%-40%.

In some embodiments, the third semiconductor layer comprises a first semiconductor sublayer and a second semiconductor sublayer, the first semiconductor sublayer is between the gate electrode and the second semiconductor sublayer, the first semiconductor sublayer is a crystalline phase layer, and the second semiconductor sublayer is an amorphous phase layer, the gate electrode is located between the channel stack layer and the base substrate, and the interface is a surface of the second semiconductor sublayer away from the base substrate.

In some embodiments, the third semiconductor layer further comprises a third semiconductor sublayer, the third semiconductor sublayer is located between the gate electrode and the first semiconductor sublayer, and the third semiconductor layer is a crystalline phase layer.

In some embodiments, for a same etchant, a ratio of an etching rate of the third semiconductor layer to an etching rate of the second semiconductor layer is in a range of 0.2 to 5.

At least some embodiments of the disclosure provide a semiconductor substrate, comprising: a base substrate; and a thin film transistor on the base substrate, wherein the thin film transistor comprises a gate electrode, a gate insulating layer, a channel stack layer, and a source electrode and a drain electrode electrically connected to the channel stack layer, the channel stack layer comprises: a seed layer of a first oxide semiconductor material, a first channel layer of a second oxide semiconductor material and a second channel layer of a third oxide semiconductor material, wherein the second channel layer is located between the gate electrode and the first channel layer, the second oxide semiconductor material is different from the third oxide semiconductor material, the first channel layer and the seed layer are crystalline phase layers, both the first oxide semiconductor material and the second oxide semiconductor material are materials that are capable of forming crystalline phases at a second temperature, and the second temperature is less than or equal to 40° C., wherein the semiconductor substrate further comprises an interface on the base substrate, a distance between a surface of the first channel layer facing the base substrate and the interface is less than or equal to 100 angstroms, and the seed layer is located between the interface and the surface of the first channel layer facing the base substrate.

In some embodiments, the gate electrode is located between the channel stack layer and the base substrate, and the interface is a surface of the second channel layer away from the base substrate.

In some embodiments, the semiconductor substrate further comprises: an insulating layer on the base substrate, wherein the insulating layer is located between the seed layer and the base substrate, the channel stack layer is located between the gate electrode and the base substrate, and the interface is a surface of the insulating layer away from the base substrate.

In some embodiments, the channel stack layer has a bottom surface facing the base substrate and a side surface, both the bottom surface and the side surface are planar surfaces, and a first included angle between the bottom surface and the side surface is 20° to 70°.

In some embodiments, the channel stack layer has a bottom surface facing the base substrate and a side surface, the side surface comprises a first sub-side surface and a second sub-side surface, all of the bottom surface, the first sub-side surface and the second sub-side surface are planar surfaces, a second included angle between the bottom surface and the first sub-side surface is 50° to 80°, a third included angle between the second sub-side surface and the bottom surface is 20° to 70°, and the second included angle is different from the third included angle.

In some embodiments, the second channel layer is an amorphous phase layer.

In some embodiments, an electron mobility of the second channel layer is greater than electron mobilities of the seed layer and the first channel layer.

In some embodiments, a thickness of the first channel layer is four to eight times of a thickness of the seed layer.

In some embodiments, a band gap $Eg1$ of the second channel layer, a band gap $Eg2$ of the seed layer and a band gap $Eg3$ of the first channel layer satisfy: $Eg1 < Eg2 \leq Eg3$; a conduction band bottom energy level $Ec1$ of the second channel layer, a conduction band bottom energy level $Ec2$ of the seed layer and a conduction band bottom energy level $Ec3$ of the first channel layer satisfy: $|Ec1| > |Ec2| \geq |Ec3|$; a valence band top energy level $Ev1$ of the second channel layer, a valence band top energy level $Ev2$ of the seed layer and a valence band top energy level $Ev3$ of the first channel layer satisfy: $|Ev1| < |Ev2| \leq |Ev3|$.

In some embodiments, a thickness of the seed layer is 50 angstroms to 100 angstroms.

In some embodiments, the first oxide semiconductor material is the same as the second oxide semiconductor material.

In some embodiments, each of the first oxide semiconductor material and the second oxide semiconductor material comprises two or more metal elements of In, Ga, Zn and Sn.

In some embodiments, the first oxide semiconductor material is IGZO material, wherein a ratio of an atomic number of In to a sum of atomic numbers of In, Ga and Zn is 7%-14%; a ratio of an atomic number of Ga to a sum of atomic numbers of In, Ga and Zn is 20%-40%; a ratio of an atomic number of Zn to a sum of atomic numbers of In, Ga and Zn is 50%-70%.

In some embodiments, the first oxide semiconductor material is IGZO material, wherein a ratio of an atomic number of In to a sum of atomic numbers of In, Ga and Zn is 35%-50%; a ratio of an atomic number of Ga to a sum of atomic numbers of In, Ga and Zn is 10%-40%; a ratio of an atomic number of Zn to a sum of atomic numbers of In, Ga and Zn is 20%-40%.

In some embodiments, the second channel layer comprises a first channel sublayer and a second channel sublayer, the first channel sublayer is between the gate electrode and the second channel sublayer, the first channel sublayer is a crystalline phase layer, and the second channel sublayer is an amorphous phase layer, the gate electrode is located between the channel stack layer and the base substrate, and the interface is a surface of the second channel sublayer away from the base substrate.

In some embodiments, the second channel layer further comprises a third channel sublayer, the third channel sublayer is located between the gate electrode and the first channel sublayer, and the third channel layer is a crystalline phase layer.

In some embodiments, for a same etchant, a ratio of an etching rate of the second channel layer to an etching rate of the first channel layer is in a range of 0.2 to 5.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

The technical solutions in the embodiments of the present disclosure will be clearly and completely described below in combination with the accompanying drawings, and the exemplary embodiments of the present disclosure and their various features and advantageous details will be described more comprehensively with reference to the non-limiting exemplary embodiments illustrated in the accompanying drawings and detailed in the following description. It should be noted that the features shown in the figure do not have to be drawn to scale. The description of known materials, components and process technologies is omitted so as not to obscure the exemplary embodiments of the present disclosure. The examples are only intended to facilitate understanding the implementation of the example embodiments of the present disclosure and further enable those skilled in the art to implement the exemplary embodiments. Therefore, the examples should not be understood as limiting the scope of the exemplary embodiments of the present disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The words "on", "beneath", "left", "right" and the like only indicate the relative position relationship which is correspondingly changed when the absolute position of a described object is changed. In addition, in the present disclosure, a certain value point and the upper and lower limit value points of a certain value range include all value points within the deviation range of ±5% of the corresponding value point.

In the oxide semiconductor thin film transistor, a layer of oxide for resisting the corrosion from the etchant may be added to the top layer of the channel layer and serves as an etching stop layer, so as to reduce the corrosion of the etchant to the bottom layer of oxide during the source/drain etching process, such that the back channel defect is reduced, and the stability and mobility of the transistor are improved. For example, adding an oxide etching stop layer may reduce the etching defect of the back channel and improve the stability of the device.

As limited by the materials, the existing materials of active layers cannot crystallize at room temperature and must be crystallized under a high temperature environment (may be micro-crystallized under a high temperature and high oxygen environment). The inventors of the present application found that: a metal oxide semiconductor material with a specific element ratio may form a crystalline phase layer at room temperature, and the crystalline phase layer formed at room temperature will have a mismatch region (i.e., a defect layer) at the growth interface.

Figure 8A:
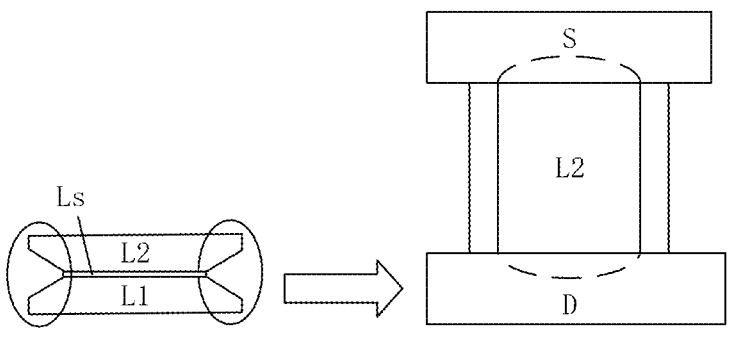
FIG. 8A illustrates a schematic view of undercut formed in the patterning process in the related art.
Figure 8B:
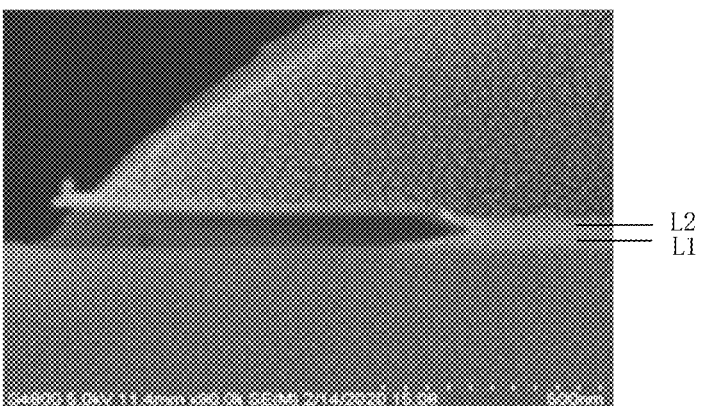
FIG. 8B illustrates a scanning electron micrograph of a channel stack layer in the related art.
Figure 8C:
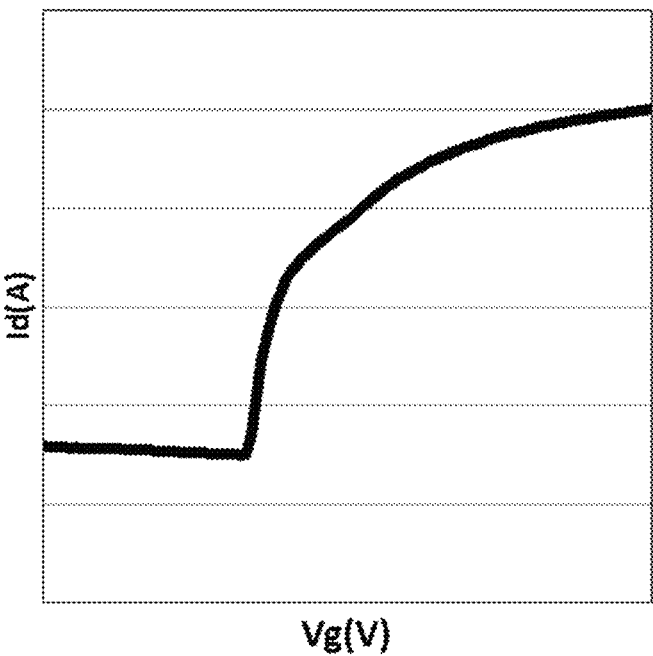
FIG. 8C is I-V characteristic testing result of thin film transistors with undercut in stacked channels in related technology.

In the related art, under the circumstances that the channel layer includes two oxide semiconductor layers L1 and L2, if the oxide semiconductor layer L2 of crystalline phase is formed on the oxide semiconductor layer L1 at room temperature, the material of the oxide semiconductor layer L2 is a material crystallizable at room temperature, and a defect layer Ls is easily generated at an interface thereof due to lattice mismatch. Due to the fast etching rate of the defect layer Ls, the etchant is easy to undercut along the interface between the two oxide semiconductor layers, thereby forming an undercut in the patterning process, as illustrated in FIG. 8A and FIG. 8B, if the undercut are formed, the etchant will etch the joint position between the source/drain electrodes S/D and the channel stack layer in the subsequent source/drain etching process, resulting in the occurrence of disconnection of the source/drain electrodes (see the dotted line in FIG. 8A), which will reduce the stability and yield of the thin film transistor. In addition, under the circumstances that the oxide semiconductor layer L2 is formed on the insulating layer directly at room temperature, the material of the oxide semiconductor layer L2 is a material crystallizable at room temperature, and it is also easy to generate a defect layer at the interface between the insulating layer and the oxide semiconductor layer L2 due to lattice mismatch. Due to the large etching rate of the defect layer, the etchant is easy to undercut along the interface between the oxide semiconductor layer and the insulating layer, thereby forming undercut during the patterning process. FIG. 8C also illustrates the I-V characteristic testing result of the thin film transistor with a stack-layer channel having undercut in the related art. As can be seen from FIG. 8C, the fluctuation of I-V characteristic of the thin film transistor in the off-state in related art is obvious, which is due to the adverse effects generated by the undercut on the side surface of the channel stack layer during the etching process.

At least one embodiment of the present disclosure provides a method of manufacturing a semiconductor substrate, including: providing a base substrate; forming a semiconductor stack layer including a first semiconductor layer, a second semiconductor layer and a third semiconductor layer on the base substrate through using a physical vapor deposition process, including: forming the first semiconductor layer at an interface on the base substrate when the base substrate is at a first temperature, wherein a material of the first semiconductor layer is a first oxide semiconductor material; forming the second semiconductor layer directly on the first semiconductor layer, wherein a material of the second semiconductor layer is a second oxide semiconductor material; and forming the third semiconductor layer, wherein a material of the third semiconductor layer is a third oxide semiconductor material; performing a patterning process on the semiconductor stack layer, such that the first semiconductor layer, the second semiconductor layer and the third semiconductor layer are respectively patterned into a seed layer, a first channel layer and a second channel layer, wherein the seed layer, the first channel layer and the second channel layer constitute a channel stack layer; forming a gate electrode and a gate insulating layer on the base substrate; and forming a source electrode and a drain electrode on the base substrate formed with the channel stack layer, the source electrode and the drain electrode are electrically connected to the channel stack layer, wherein the second channel layer is located between the gate electrode and the first channel layer, the first oxide semiconductor material is different from the third oxide semiconductor material, the first channel layer and the seed layer are crystalline phase layers, wherein the first oxide semiconductor material and the second oxide semiconductor material are capable of forming crystalline phases at a second temperature, the second temperature is less than or equal to 40° C., and the first temperature is greater than or equal to 100° C.

At least another embodiment of the present disclosure provides a semiconductor substrate, including: a base substrate; and a thin film transistor on the base substrate, wherein the thin film transistor includes a gate electrode, a gate insulating layer, a channel stack layer and source/drain electrodes electrically connected to the channel stack layer, the channel stack layer includes: a seed layer of a first oxide semiconductor material, a first channel layer of a second oxide semiconductor material and a second channel layer of a third oxide semiconductor material, wherein the second channel layer is located between the gate electrode and the first channel layer, the second oxide semiconductor material is different from the third oxide semiconductor material, the first channel layer and the seed layer are crystalline phase layers, the first oxide semiconductor material and the second oxide semiconductor material are materials capable of forming crystalline phase at a second temperature, the second temperature is less than or equal to 40° C., wherein the semiconductor substrate also includes an interface on the base substrate, a distance between a surface of the first channel layer facing the base substrate and the interface is less than or equal to 100 angstroms, the seed layer is located between the interface and the surface of the first channel layer facing the base substrate. Herein, the interface on the base substrate does not specifically refer to a surface of the base substrate itself, but may also refer to surfaces that contact each other of two different material layers formed on the base substrate. The different material layers include an insulating layer and a semiconductor layer.

In the above-described embodiments of the present disclosure, since a higher first temperature is used to form a first semiconductor layer on the interface, and the first semiconductor layer is formed with a first oxide semiconductor material capable of forming crystalline phase at a lower second temperature (e.g., room temperature or lower than room temperature), and a second semiconductor layer of crystalline phase is then formed directly on the first semiconductor layer, as such, a defect layer existing when the second semiconductor layer is formed directly on the interface at room temperature is eliminated or the thickness of the defect layer is effectively reduced, thereby avoiding the phenomenon of undercut in the subsequent etching process performed on the oxide semiconductor stack layer.

Figure 1:
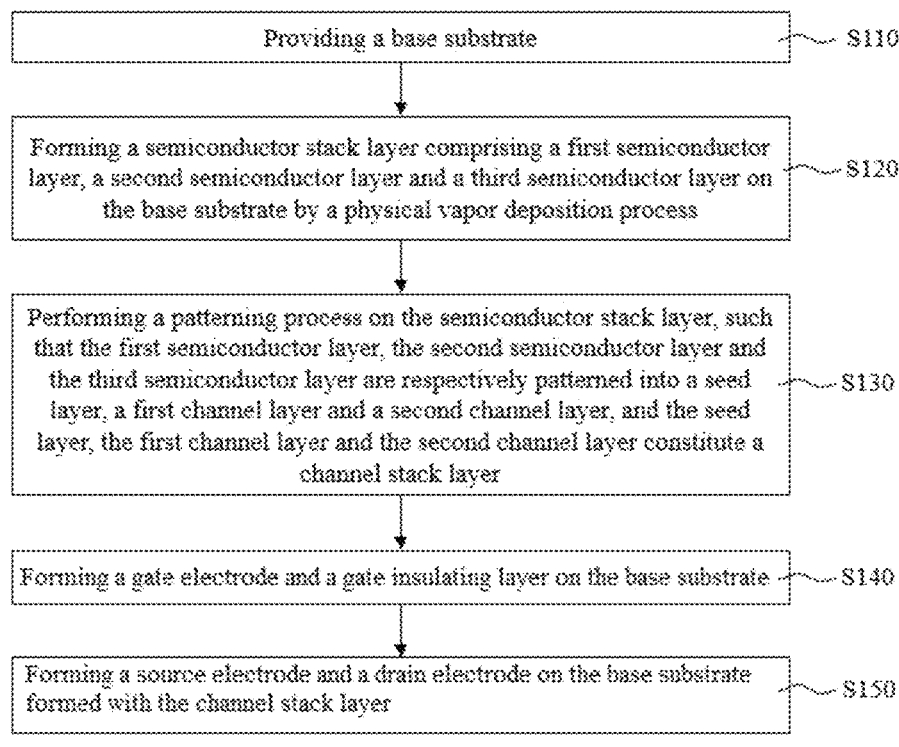
FIG. 1 illustrates a flowchart of a manufacturing method of a semiconductor substrate according to at least one embodiment of the present disclosure.

FIG. 1 illustrates a flowchart of a manufacturing method of a semiconductor substrate according to at least one embodiment of the present disclosure.

Referring to FIG. 1, a manufacturing method of a semiconductor substrate according to at least one embodiment of the present disclosure includes the following steps:

S110: providing a base substrate;

S120: forming a semiconductor stack layer including a first semiconductor layer, a second semiconductor layer and a third semiconductor layer on the base substrate using a physical vapor deposition process;

S130: performing a patterning process on the semiconductor stack layer, such that the first semiconductor layer, the second semiconductor layer and the third semiconductor layer are patterned into a seed layer, a first channel layer and a second channel layer respectively, wherein the seed layer, the first channel layer and the second channel layer constitute a channel stack layer;

S140: forming a gate electrode and a gate insulating layer on the base substrate;

S150: forming a source electrode and a drain electrode on the base substrate formed with the channel stack layer.

In the manufacturing method of the semiconductor substrate according to at least one embodiment of the present disclosure, the sequence of performing steps S110 to S150 is not limited. Depending on that the structures to be formed are different (e.g., whether the thin film transistor on the substrate is a top gate structure or a bottom gate structure), the sequence of performing steps S110 to S150 may be adjusted accordingly. In addition, the manufacturing method of the semiconductor substrate according to at least one embodiment of the present disclosure may also include steps of forming other layers and corresponding pixel structures. A manufacturing method of a semiconductor substrate according to at least one embodiment of the present disclosure will be described in detail as below in combination with the accompanying drawings. Embodiments of the present disclosure are not limited to the specific examples described herein.

FIG. 2A to FIG. 2H illustrate schematic views of substrate structures corresponding to the respective steps in the manufacturing method of the semiconductor substrate 100 according to an embodiment of the present disclosure.

Figure 2A:
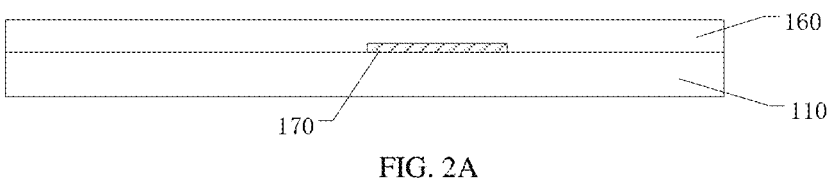
FIG. 2A to FIG. 2H illustrate schematic views of substrate structures corresponding to the respective steps in the manufacturing method of the semiconductor substrate according to an embodiment of the present disclosure.

Referring to FIG. 2A, a base substrate 110 is provided, and a gate electrode 170 and a gate insulating layer 160 are formed on the base substrate 110. The base substrate 110 may be a rigid substrate or a flexible substrate. For example, the material of the base substrate 110 may be glass, polyimide, polycarbonate, polyethylene, polyacrylate, polyethylene terephthalate, etc. The gate insulating layer 160 may be formed as a single layer of silicon nitride (SiNx) or silicon oxide ($SiO_2$) or a stack layer of silicon nitride (SiNx) and silicon oxide ($SiO_2$).

Figure 2B:
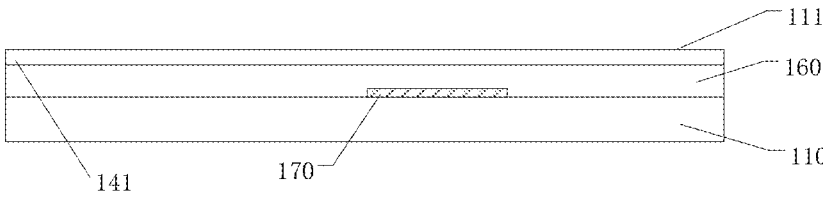
Figure 2C:
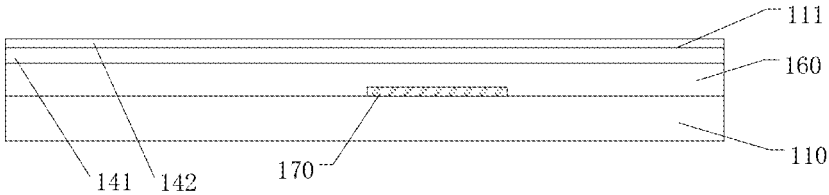
Figure 2D:
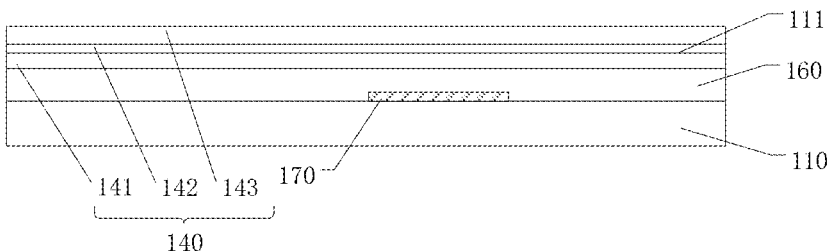

Referring to FIG. 2B to FIG. 2D, a semiconductor stack layer 140 is formed on the gate insulating layer 160 using a physical vapor deposition process, such as a sputtering process. The semiconductor stack layer 140 includes a semiconductor layer 141, a semiconductor layer 142, and a semiconductor layer 143.

Herein, it is described taken the example that both the materials of the semiconductor layer 142 and the semiconductor layer 143 are indium-gallium-zinc-oxide (IGZO, wherein I represents indium element (In), G represents gallium element (Ga), Z represents zinc element (Zn), and O represents oxygen element. For example, the metal oxide semiconductor of each of the semiconductor layer 142 and the semiconductor layer 143 contains two or more metal elements selected from In, Ga, Zn and Sn. Embodiments of the present disclosure are not limited thereto. In another embodiment, the materials of the semiconductor layer 142 and the semiconductor layer 143 may also be In—Sn—Zn—O material, In—Al—Sn—Zn—O material.

Herein, taking the semiconductor stack layer 140 with a three-layer structure including a semiconductor layer 141, a semiconductor layer 142 and a semiconductor layer 143 as an example for description. Embodiments of the present disclosure are not limited thereto. In another embodiment, the semiconductor stack layer 140 may also include other semiconductor layers, therefore, the semiconductor stack layer 140 may be a four-layer structure or a structure including more than four layers, as long as the semiconductor stack layer 140 includes the semiconductor layer 141, the semiconductor layer 142 and the semiconductor layer 143 disposed in a specified sequence. In some other embodiments, there may be free of obvious interface between the semiconductor layer 142 and the semiconductor layer 143, that is, the semiconductor layer 142 and the semiconductor layer 143 are substantially connected as a continuous layer. In this case, the semiconductor stack layer 140 may also be a bilayer structure.

Herein, the sputtering process generally bombards the surface of the solid target with particles (ions, neutral atoms or molecules) with a certain energy, such that the atoms or molecules on the surface of the solid target are ejected from the solid target, and dropped on the surface of the base substrate with a certain energy, thereby forming a film on the base substrate.

Referring to FIG. 2B, a semiconductor layer 141 is deposited on the gate insulating layer 160. Herein, the deposition temperature of the semiconductor layer 141 is not limited. The material of the semiconductor layer 141 is an oxide semiconductor material. For example, the material of the semiconductor layer 141 is deposited at a lower second temperature (e.g., a room temperature of 0° C. to 40° C. or a lower temperature) to form an amorphous phase layer. It should be noted that, the temperature described herein refers to the temperature at the base substrate during the physical vapor deposition process.

For example, the oxide semiconductor material of the semiconductor layer 141 is, for example, IGZO (111), IGZO (423), IGZO (136), IGZO (432), IGZO (312), IGZO (513), IGZO (534), IGZO (713), IGZO (514), IGZYO, IGTO, ITZO, IZO, ITO, etc. Herein, the values in brackets represent the ratio of the atomic numbers of In, Ga and Zn in the materials. For example, IGZO (423) indicates that the ratio of the atomic numbers of In, Ga and Zn in the material is 4:2:3. Preferably, the oxide semiconductor material of the semiconductor layer 141 is a material with high mobility. For example, the oxide semiconductor material of the semiconductor layer 141 is IGZO (423), which has a narrow band gap (2.5-2.7 eV), a high carrier concentration ($1\times10^{16}$–$9\times10^{16}$) and a high carrier Hall mobility (15-25 $cm^2/V\cdot s$) when the material is in the state of amorphous phase.

The crystal morphology and the oxide semiconductor material of the semiconductor layer 141 are not limited by the embodiments of the disclosure. For example, in another embodiment, the semiconductor layer 141 may be a crystalline phase layer. The material of the semiconductor layer 141 may be other metal oxide semiconductor materials which are not mentioned above.

Thereafter, referring to FIG. 2C, a semiconductor layer 142 is deposited on the upper surface (interface) 111 of the semiconductor layer 141 at a higher first temperature, the upper surface (interface) 111 is away from the base substrate 110. Herein, the interface refers to the surface where two different material layers contact each other. The upper surface 111 is the interface between the semiconductor layer 141 and the atmosphere in the deposition chamber before forming the semiconductor layer 142, and the upper surface 111 is the interface between the semiconductor layer 141 and the semiconductor layer 142 after forming the semiconductor layer 142. The first temperature is greater than or equal to 100° C. Preferably, the first temperature is greater than or equal to 120° C. In one example, the first temperature is at least 60° C. higher than the second temperature.

The material of the semiconductor layer 142 is an oxide semiconductor material different from the semiconductor layer 141. Herein, two materials being the same, means that not only the types and numbers of the elements contained in the two materials are the same, but also the proportions of each element among all elements are the same (herein, the corresponding proportion is allowed to have an error of less than 5% caused by process accuracy). Therefore, two materials being different indicates that the two materials contain different types of elements, different numbers of elements, or different proportions of each element in all elements.

For example, the oxide semiconductor material of the semiconductor layer 142 is an oxide semiconductor material that is capable of forming a crystalline phase at a second temperature (e.g., room temperature). Herein, the position of the crystalline phase in the oxide semiconductor material formed at the second temperature is not limited, as long as the oxide semiconductor material can form the crystalline phase within a sufficient thickness range (e.g., 500 angstroms), it can be considered as an oxide semiconductor material capable of forming a crystalline phase at the second temperature. Since the first temperature is at least 60° C. higher than the second temperature, for oxide semiconductor materials capable of forming crystalline phase at room temperature or a lower temperature, the first temperature greater than or equal to 100° C. can effectively promote the rapid crystallization of the oxide semiconductor material at the growth interface, so as to effectively reduce the defect layer at the interface.

For example, the material of the semiconductor layer 142 may be a metal oxide semiconductor material including two or more metal elements selected from In, Ga, Zn and Sn, such as IGZO(136), IGZO(423), IGZO(132), IGZO(243), IGZO(153), IGO, ITZO, etc.

In an example of indium-gallium-zinc oxide material crystallizable at room temperature, the ratio of the atomic number of In to the sum of the atomic numbers of In, Ga and Zn is 7%-14%; the ratio of the atomic number of Ga to the sum of the atomic numbers of In, Ga and Zn is 20%-40%; the ratio of the atomic number of Zn to the sum of the atomic numbers of In, Ga and Zn is 50%-70%. The indium-gallium-zinc oxide material can form a crystalline phase layer at room temperature through a physical vapor deposition process (the oxygen partial pressure is preferably between 0-50% ($O_2/Ar+O_2$)). In another example of indium-gallium-zinc oxide material crystallizable at room temperature, the ratio of the atomic number of In to the sum of the atomic numbers of In, Ga and Zn is 35%-50%; the ratio of the atomic number of Ga to the sum of the atomic numbers of In, Ga and Zn is 10%-40%; the ratio of the atomic number of Zn to the sum of the atomic numbers of In, Ga and Zn is 20%-40%. The indium-gallium-zinc oxide material can form a crystalline phase layer at about 25° C. by physical vapor deposition process (oxygen partial pressure is preferably greater than 50%).

For example, the oxide semiconductor material of the semiconductor layer 142 is a Zn-rich IGZO material. For example, in the Zn-rich IGZO material, the ratio of the atomic number of Zn to the sum of the atomic numbers of In, Ga and Zn is greater than or equal to 60%. For example, the material of the semiconductor layer 142 is IGZO(136), which has a wide band gap (2.9-3.3 ev) and a low carrier concentration ($1\times10^{14}$–$5\times10^{15}$). The IGZO(136) of the semiconductor layer 142 is capable of being formed in a crystalline state (e.g., C-axis aligned crystalline (CAAC)) at room temperature. In this embodiment, the crystalline semiconductor layer 142 is formed by a sputtering deposition at a temperature greater than 100° C., so as to reduce or eliminate the possible defect layer at the interface 111. For example, the conduction band bottom energy level of the IGZO(136) crystalline phase layer of the semiconductor layer 142 is higher than the conduction band bottom energy level of the IGZO(423) amorphous phase layer of the semiconductor layer 141, and the valence band top energy level of the IGZO(136) crystalline phase layer of the semiconductor layer 142 is lower than the valence band top energy level of the IGZO(423) amorphous phase layer of the semiconductor layer 141.

Herein, the thickness of the semiconductor layer 142 of crystalline phase is, for example, 50 to 100 angstroms. If a X-ray diffraction test (e.g., the diffraction angle scanning range is 20° to 70°, and the scanning step size is 0.02°/s) is performed on the semiconductor layer 142, a protruding crystalline diffraction peak can be observed on the denoised XRD pattern. For example, when the material of the semiconductor layer 142 is an indium-gallium-zinc oxide, there is a crystalline diffraction peak at the diffraction angle of 25-35° on the XRD ray diffraction pattern. For the same materials with the same thickness, in the XRD pattern obtained by the same XRD test, the higher the intensity of the crystalline diffraction peak at the same position, the smaller the full width at half maximum, and the greater the ratio of the integral area of the crystalline peak to the total integral area, the higher the degree of crystallinity. In addition, whether the material layer under test is a crystalline phase layer can also be determined by a high-resolution transmission electron microscopy photo and electron diffraction patterns in the selected region thereof.

If a comparative semiconductor layer with the same thickness as the semiconductor layer 142 is deposited with the same material as the semiconductor layer 142 using the same sputtering process as the semiconductor layer 142 (the difference only lies in that the temperature of the base substrate is at room temperature), the comparative semiconductor layer is an amorphous phase layer. Both the thickness of the semiconductor layer 142 of the crystalline phase and the thickness of the comparative semiconductor layer are, for example, 50 to 100 angstroms. That is, although a material capable of crystallizing at room temperature is used for forming the semiconductor layer, an amorphous phase layer will still be formed at a position very close to the deposition interface at the room temperature, such as the comparative semiconductor layer described here. The amorphous semiconductor layer is not easy to be found due to its small thickness, but it is easy to cause undercut in the subsequent etching process. The inventor found that the oxide semiconductor material crystallizable at room temperature can be deposited at a higher temperature from the beginning, and a crystalline phase layer (such as the above-described semiconductor layer 142) can be formed within a thickness range of a very small distance (e.g., 100 angstroms) from the deposition interface. In other words, the high temperature process prompts the material that is crystallizable at room temperature to form the semiconductor layer 142 of crystalline phase at a position closer to the deposition interface at a faster rate, the semiconductor layer 142 of crystalline phase replaces the amorphous comparative semiconductor layer that is formed at the same position at room temperature, thereby effectively avoiding the possible undercut in the subsequent etching process.

Herein, the "crystalline phase layer" refers to the oxide semiconductor layer mainly containing the oxide semiconductor in the crystalline phase state, and may also contain tiny amorphous parts; "amorphous phase layer" refers to a layer mainly containing oxide semiconductor in amorphous phase state, and may also contain tiny parts in crystalline phase.

In the present embodiment, the semiconductor layer 142 deposited at a higher temperature can directly form a crystalline phase layer on the surface (Interface) 111, so as to replace the defect layer existing at the corresponding position under the circumstances that the semiconductor layer 142 is deposited at room temperature, such that obvious undercut will not be caused in the subsequent patterning process.

Referring to FIG. 2D, a semiconductor layer 143 is deposited on the upper surface of the semiconductor layer 142 away from the base substrate 110. The oxide semiconductor material of the semiconductor layer 143 is capable of being deposited as a crystalline phase layer at room temperature; for example, the oxide semiconductor materials of the semiconductor layer 143 and the semiconductor layer 142 are the same, such that a defect region between the semiconductor layer 143 and the semiconductor layer 142 is better avoided and reduced. Of course, the present embodiment is not limited thereto. In another example, the materials of the semiconductor layer 143 and the semiconductor layer 142 may be different. The material of the semiconductor layer 143 may be a metal oxide semiconductor material containing two or more metal elements selected from In, Ga, Zn and Sn, such as IGZO(136), IGZO(423), IGZO(132), IGZO(243), IGZO(153), IGO, ITZO, etc.

In the present embodiment, the deposition temperature of the semiconductor layer 143 is not limited, as long as the semiconductor layer 143 is formed into a crystalline phase layer. That is to say, the semiconductor layer 143 is capable of being deposited into a crystalline phase layer at room temperature, and may also be formed into a crystalline phase layer at the first temperature.

Since the semiconductor layer 142 is deposited at a higher temperature, the crystallinity of the semiconductor layer 142 is higher than a material layer with a same thickness deposited at room temperature. The higher crystallinity of the semiconductor layer 142 has a good crystallization induction effect for the semiconductor layer 143 subsequently formed directly thereon, in this case, the semiconductor 143 may have a better crystallinity. In other words, due to the crystallization induction effect of the semiconductor layer 142 with a higher crystallinity, the semiconductor layer 143 may have a better crystallinity and compactness even if the semiconductor layer 143 is deposited at room temperature.

For example, the thickness of the semiconductor layer 143 is four to eight times of the thickness of the semiconductor layer 142. This thickness range has a better effect in avoiding undercut, and inducing crystallization. However, the present embodiment is not limited thereto.

The semiconductor layer 143 is directly formed on the crystalline semiconductor layer 142, which has the effect of inducing crystallization of the semiconductor layer 143. Therefore, on the one hand, there is free of defect layer that may cause obvious undercut in the etching process at the interface between the semiconductor layer 142 and the semiconductor layer 143, no matter the semiconductor layer 143 is formed at room temperature or a higher temperature; on the other hand, the semiconductor layer 143 of crystalline phase may be formed to be more uniform and compact, such that the semiconductor layer 143 is not easy to be etched to form defects in the subsequent patterning process.

In one example, the materials and the deposition temperatures of the semiconductor layer 143 and the semiconductor layer 142 are the same, such that there may be no obvious interface between the semiconductor layer 143 and the semiconductor layer 142.

In another example, the materials of the semiconductor layer 143 and the semiconductor layer 142 are the same, but the deposition temperature of the semiconductor layer 142 is higher (e.g., is the first temperature), while the semiconductor layer 143 is deposited at room temperature, then the crystallinity of the semiconductor layer 142 is greater than the crystallinity of the semiconductor layer 143 under the circumstances that the semiconductor layer 142 and the semiconductor layer 143 have the same thickness.

Optionally, for example, an annealing process may be performed on the oxide semiconductor stack layer 140 after the semiconductor stack layer 140 is formed. Herein, a thermal treatment is performed in an atmospheric atmosphere at a temperature above 300° C. and below 380° C. The duration of the thermal treatment is, for example, more than 30 minutes and less than 2 hours.

In the above-described method, the semiconductor stack layer 140 is formed through controlling the composition and forming condition of the film. The inventor of the present application has made the following analysis to confirm the crystalline state of the oxide semiconductor layer just after the film is formed (and before the annealing process) in the above-described method.

Firstly, sample substrates 1 to 4 having single-layer semiconductor films are fabricated. The sample substrate 1 is fabricated by forming a film layer of a first oxide semiconductor material on a glass substrate by sputtering. The sample substrates 2 and 3 are respectively fabricated by forming a film layer of a second oxide semiconductor material on a glass substrate at different temperatures. The sample substrate 4 is fabricated by forming a film layer of a third oxide semiconductor material on a glass substrate. Here, the first to third oxide semiconductor materials are, for example, In—Ga—Zn—O based materials. In the sample substrates 1 to 4, the thickness of the film layer of the semiconductor material on the glass substrate is 100 angstroms, for example. Table 1 illustrates the compositions of the targets used for forming the In—Ga—Zn—O based semiconductor film layers and the forming conditions of the films of the In—Ga—Zn—O based semiconductor films.

TABLE 1

| | The ratio of the target material In:Ga:Zn | The deposition condition |
| --- | --- | --- |
| Sample 1 | 4:2:3 | film-forming temperature: 100° C., oxygen proportion: 0-20%, film thickness: 0-500 Å |
| Sample 2 | 1:3:6 | film-forming temperature: 25° C., oxygen proportion: 0-50% (O$_2$/O$_2$ + Ar), film thickness: 100 Å |
| Sample 3 | 1:3:6 | film-forming temperature different from room temperature 25° C.: 130° C., oxygen proportion: 0-50% (O$_2$/O$_2$ + Ar), film thickness: 100 Å |
| Sample 4 | 1:3:6 | film-forming temperature: 25° C., oxygen proportion: 0-50% (O$_2$/O$_2$ + Ar), film thickness: 400 Å |

Next, X-ray diffraction (XRD) analysis of the formed sample substrates is performed. The X-ray diffraction patterns of the sample substrates 1 to 4 are shown in FIG. 3A to FIG. 3D, respectively.

Figure 3A:
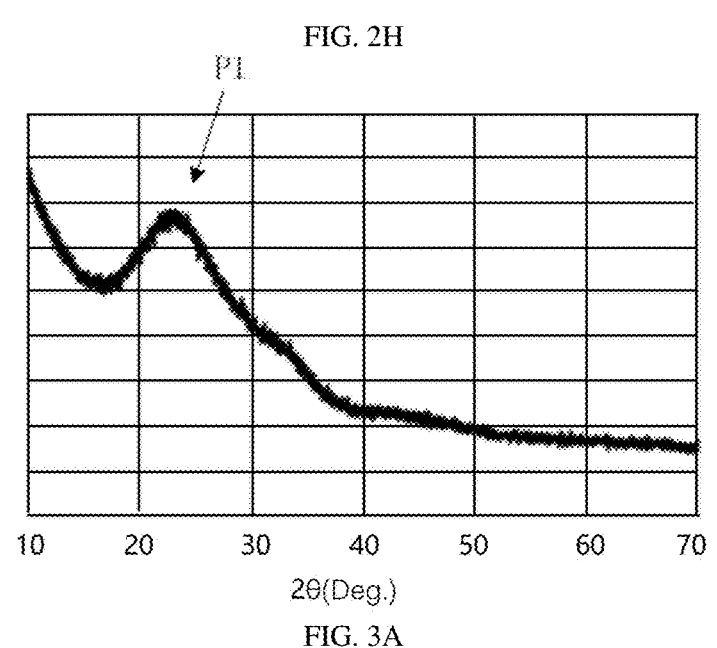
FIG. 3A to FIG. 3D are diagrams illustrating XRD analysis results of sample substrates 1 to 4.
Figure 3B:
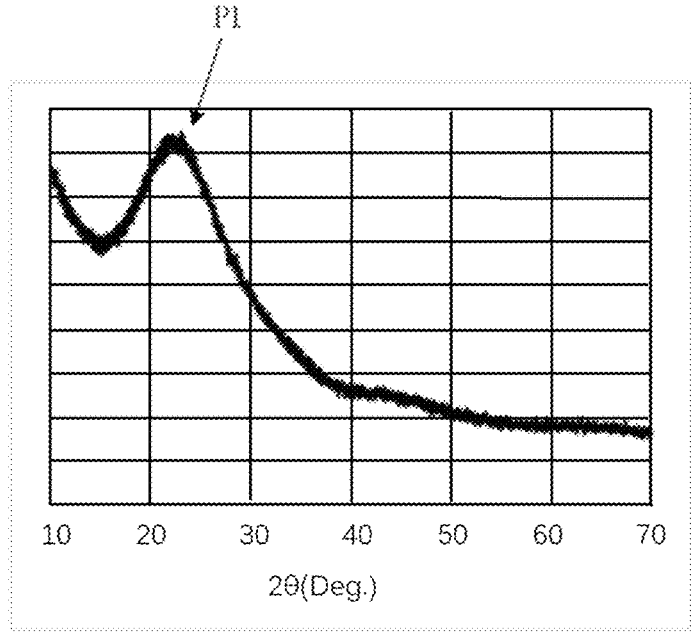
Figure 3C:
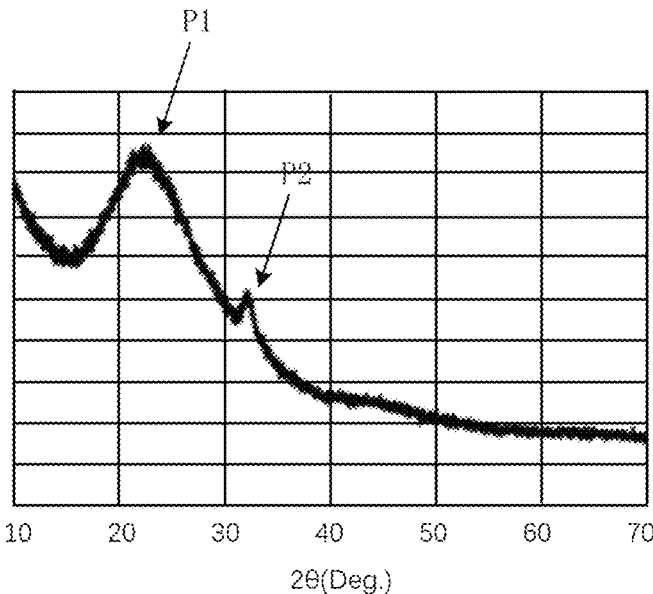
Figure 3D:
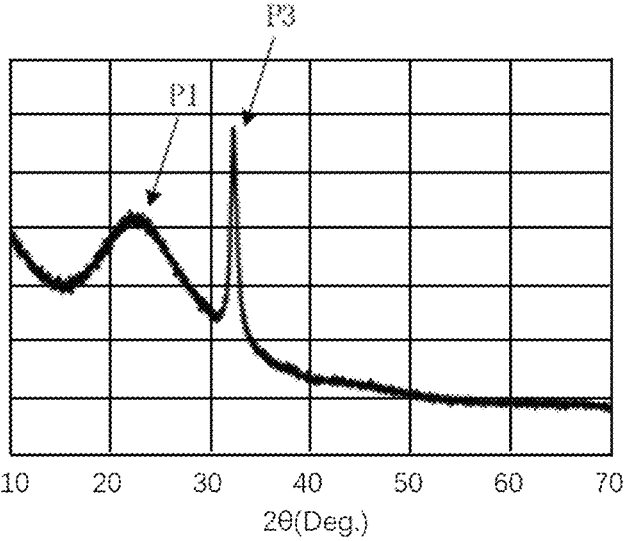

As can be seen in FIG. 3A to FIG. 3D, the X-ray diffraction patterns of all sample substrates have wide peaks P1 at 2θ=20-25°. Considering that this is the peak caused by the glass substrate. As shown in FIG. 3A and FIG. 3B, there are no crystalline peaks shown in the X-ray diffraction patterns of the sample substrates 1 and 2, in addition to the peaks P1 of the glass substrates, therefore, it can be confirmed that the semiconductor film layer on the sample substrate 1 (which may correspond to the semiconductor layer 141) and the semiconductor film layer on the sample substrate 2 (which may correspond to the comparative semiconductor layer) are amorphous phase films; sample 2 may also include a small amount of microcrystalline region, but the overall structure is mainly amorphous, therefore, the XRD pattern shows no crystalline diffraction peak; as shown in FIG. 3C, the X-ray diffraction pattern of the sample substrate 3 further has a crystalline peak P2 near the position 2θ=32°, in addition to the peak P1 of the glass substrate. The sample 3 also includes a small amount of amorphous region, but the overall structure is mainly crystalline, therefore, the XRD pattern shows a crystalline diffraction peak. In addition, as shown in FIG. 3D, the X-ray diffraction pattern of the sample substrate 4 further has a crystalline peak P3 near the position 2θ=32°, in addition to the peak P1 of the glass substrate. Therefore, it can be confirmed that both the semiconductor film layer (which may correspond to the semiconductor layer 142) on the sample substrate 3 and the semiconductor film layer (which may correspond to the semiconductor layer 143) on the sample substrate 4 are films of crystalline phase. The peak P3 of the sample substrate 4 is sharper (the peak width is smaller) than the peak P2 of the sample substrate 3, therefore, it can be known that the semiconductor film of the sample substrate 4 has a higher crystallinity. When the semiconductor layer 143 is formed at room temperature, the XRD peak position is slightly shifted to the right compared with the seed layer (that is, the peak position of the crystallization peak of the semiconductor layer 143 prepared at room temperature is about 32.2°, while the peak position of the crystallization peak of the semiconductor layer 142 prepared at the higher first temperature is about 31.8°).

Further, even if the above annealing treatment is performed on the sample substrates 1 and 2, the semiconductor film layers thereon remain in the amorphous phase state. If the annealing treatment is performed on the sample substrates 3 and 4, sometimes the crystallinities of the semiconductor film layers thereon become further higher.

As described above, a single-layer semiconductor film is formed on the substrate, and the crystallization state thereof is investigated. However, under the circumstances that a plurality of semiconductor films are laminated to form a laminated semiconductor layer, it is difficult to investigate the crystallization states of the respective semiconductor films by XRD analysis. For example, the crystalline states of the respective layers of the laminated semiconductor layer may be investigated by observing the TEM of the cross-sections of the laminated semiconductor layer. In addition, for example, the compositions of the respective layers in the laminated semiconductor layer may be analyzed by XPS, AES, etc.

Hereinafter, referring to FIG. 4A to FIG. 4D, the crystalline states of the respective layers in the semiconductor stack layer formed in an example of the present embodiment and the crystalline state of the above-described comparative semiconductor layer will be described. For example, in the example, the semiconductor layer 141 is formed by sputtering using a target material wherein an atomic number ratio In:Ga:Zn is 4:2:3. A mixed gas of noble gas (e.g., argon) atoms and an oxidizing gas may be used as the sputtering gas (atmosphere). The oxidizing gas may be $O_2$, $CO_2$, $O_3$, $H_2O$, $N_2O$, etc. Here, a mixed gas containing Ar gas and oxygen ($O_2$) gas is used. For example, the proportion of oxygen during film formation by sputtering is set to be more than 5% and less than 20% according to the partial pressure ratio. In addition, the temperature of the base substrate during film formation is set to be any temperature between room temperature and 100° C., for example. The pressure of the gas atmosphere (sputtering pressure) is not particularly limited, as long as within the range in which the plasma can stably discharge, but is, for example, set to be 0.1-3.0 Pa.

Figure 4A:
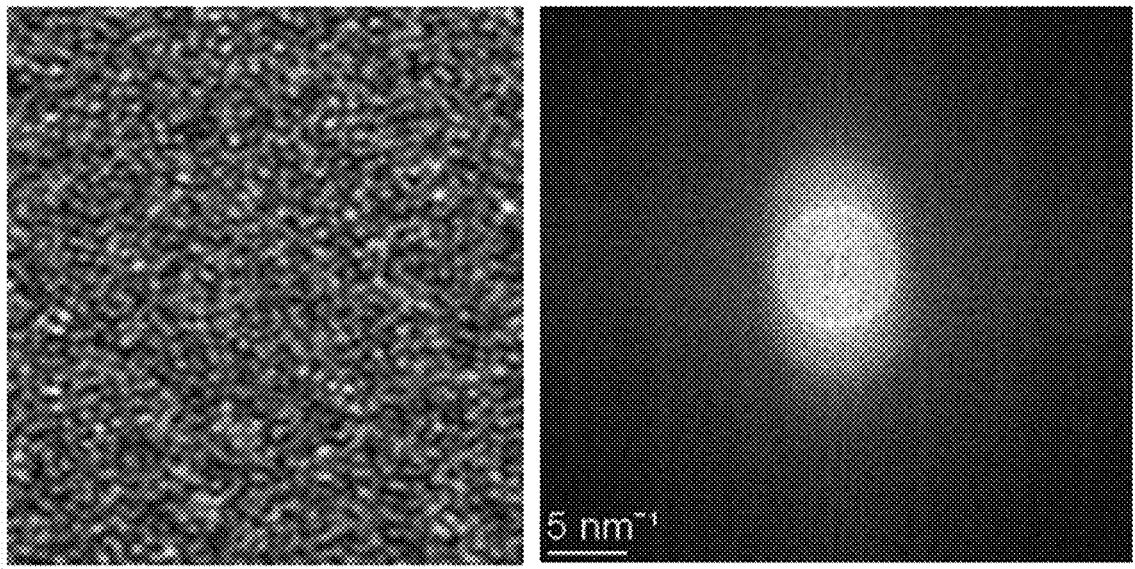
FIG. 4A to FIG. 4D are TEM pictures and FFT converted diffraction patterns of the respective semiconductor layers in a semiconductor stack layer and comparative semiconductor layers of the embodiments of the present disclosure.

FIG. 4A illustrates a TEM picture and a FFT converted diffraction pattern of the semiconductor layer 141. Referring to the left-side view of FIG. 4A, no obvious crystallization is observed in the TEM electron micrograph of the semiconductor layer 141; referring to the right-side view of FIG.

4A, there is only one diffuse central spot (that is, amorphous halo ring) in the FFT converted diffraction pattern of the semiconductor layer 141, which confirms that the semiconductor layer 141 is an amorphous phase layer.

The semiconductor layer 142 is formed by sputtering using a target material wherein an atomic number ratio In:Ga:Zn is 1:3:6. A mixed gas containing Ar gas and oxygen ($O_2$) gas is used as the sputtering gas. For example, the partial pressure ratio is set to be more than 0% and less than 50%, preferably more than 0% and less than 20%. In addition, the temperature of the base substrate during film formation is set to be the above first temperature (greater than 100° C.), for example. The pressure of the gas atmosphere (sputtering pressure) is set to be 0.1-3.0 Pa, for example.

Figure 4B:
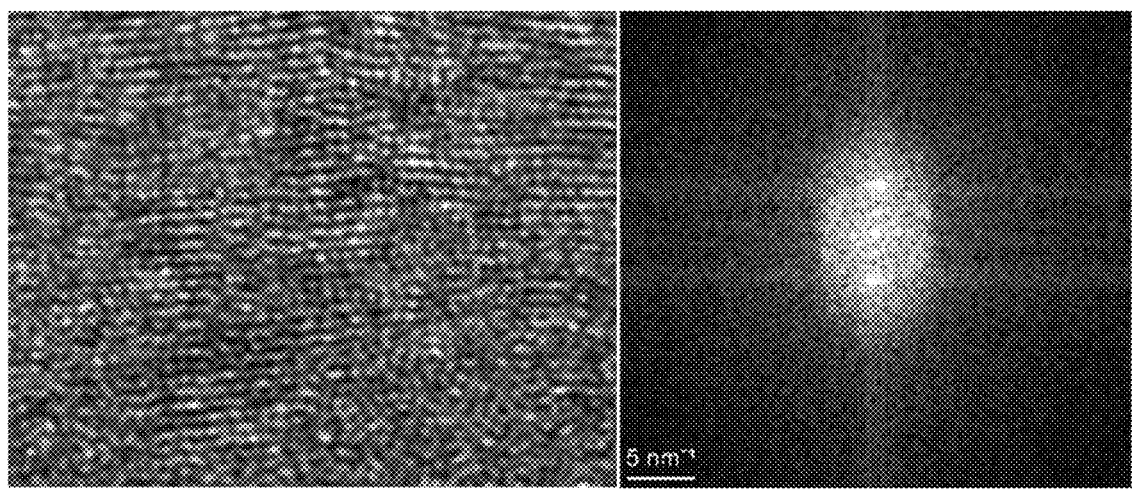

FIG. 4B illustrates a TEM picture and a FFT converted diffraction pattern of the semiconductor layer 142. Referring to the left-side view of FIG. 4B, obvious crystallization can be observed in the TEM electron micrograph of the semiconductor layer 142; referring to the right-side view of FIG. 4B, a dot matrix pattern appears in the FFT converted diffraction pattern of the semiconductor layer 142, which confirms that the semiconductor layer 142 is a crystalline phase layer.

The semiconductor layer 143 is formed by sputtering using a target wherein an atomic number ratio In:Ga:Zn is 1:3:6. A mixed gas containing Ar gas and oxygen ($O_2$) gas is used as the sputtering gas. For example, the partial pressure ratio is set to be more than 0% and less than 50%, more than 0% and less than 50%. The temperature of the base substrate and the sputtering pressure during film formation may also be the same as the temperature of the base substrate and the sputtering pressure during the formation of the semiconductor layer 142.

Figure 4C:
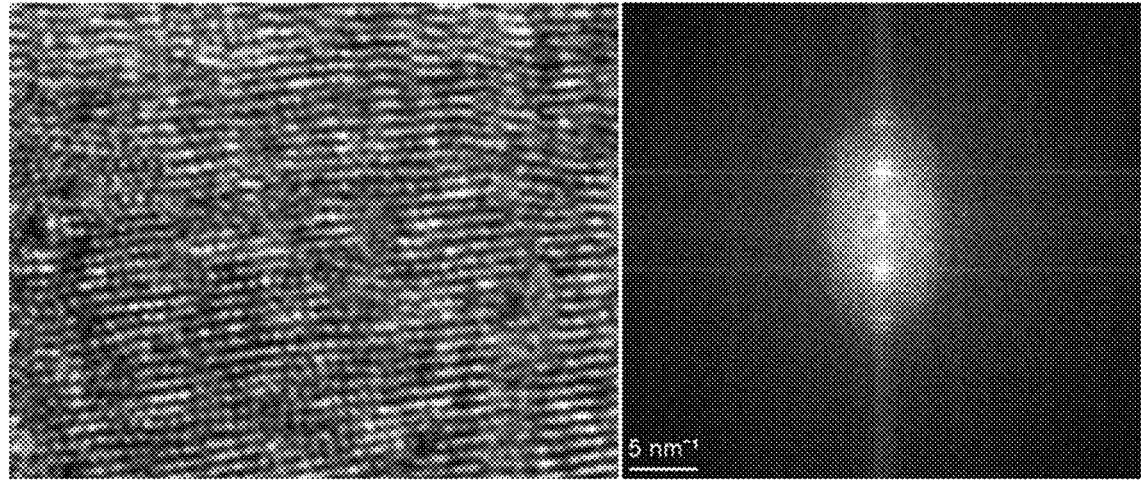

FIG. 4C illustrates a TEM picture and a FFT converted diffraction pattern of the semiconductor layer 143. Referring to the left-side view of FIG. 4C, an obvious crystallization can be observed in the TEM electron micrograph of the semiconductor layer 143; referring to the right-side view of FIG. 4C, a dot matrix pattern appears in the FFT converted diffraction pattern of the semiconductor layer 143, which confirms that the semiconductor layer 143 is a crystalline phase layer. In the present example, the deposition processes and materials of the semiconductor layers 142 and 143 are the same, and there is no significant difference and no obvious boundary region between the semiconductor layers 142 and 143. The crystallinity of the semiconductor layer 142 is lower than or equal to the crystallinity of the semiconductor layer 143. That is, the semiconductor layer 142 is smaller than the semiconductor layer 143 in terms of the overall crystal volume and the crystalline/amorphous ratio. Referring to the left-side views of FIG. 4B and FIG. 4C, the lattice arrangement of the semiconductor layer 143 is more long-range ordered than the lattice arrangement of the semiconductor layer 142; referring to the right-side views of FIG. 4B and FIG. 4C, the diffraction spots corresponding to the semiconductor layer 143 are clearer than the diffraction spots corresponding to the semiconductor layer 142.

The comparative semiconductor layer is formed by sputtering using a target wherein an atomic number ratio In:Ga:Zn is 1:3:6. A mixed gas containing Ar gas and oxygen ($O_2$) gas is used as the sputtering gas. For example, the partial pressure ratio is set to be more than 0% and less than 20%. In addition, the temperature of the base substrate during film formation is set to be room temperature, for example. The pressure of the gas atmosphere (sputtering pressure) is set to be 0.1-3.0 Pa, for example.

Figure 4D:
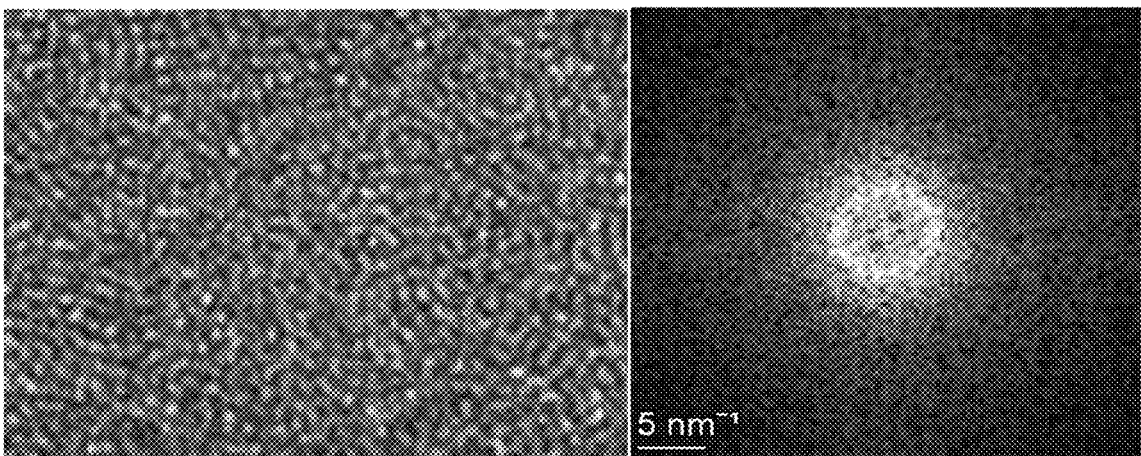

FIG. 4D illustrates a TEM picture and a FFT converted diffraction pattern of the comparative semiconductor layer 141. Referring to the left-side view of FIG. 4D, no obvious crystallization is observed in the TEM electron micrograph of the comparative semiconductor layer; referring to the right-side view of FIG. 4D, there is only one diffuse central spot (that is, amorphous halo ring) in the FFT converted diffraction pattern of the comparative semiconductor layer, which confirms that the comparative semiconductor layer is an amorphous phase layer.

Figure 2E:
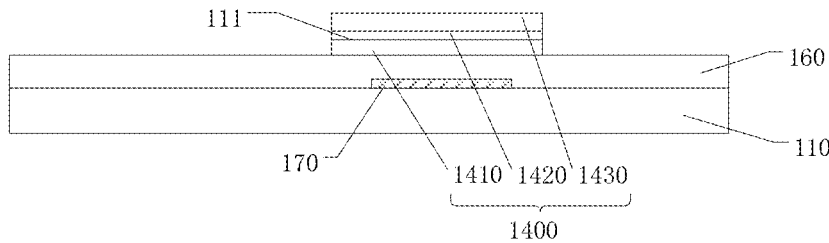

Thereafter, referring to FIG. 2E, a patterning process is performed on the semiconductor stack layer to form a channel stack layer 1400. The channel stack layer 1400 includes a channel layer 1410, a seed layer 1420, and a channel layer 1430. The channel layer 1410, the seed layer 1420 and the channel layer 1430 are parts of the semiconductor layer 141, the semiconductor layer 142 and semiconductor layer 143, respectively.

Here, performing a patterning process on the semiconductor stack layer 140 includes, for example:

coating a photoresist layer on the semiconductor stack layer 140;

performing exposure and development on the photoresist layer to form a photoresist pattern P;

performing wet etching on the semiconductor stack layer 140 using the photoresist pattern as a mask, so as to obtain the channel stack layer 1400. For example, the wet etching uses $H_2SO_4+HNO_3+H_2O$ as the etchant or using $HNO_3+CH_3COOH+H_3PO_4+H_2O$ as the etchant. Here, since there is no defect layer at the interface 111 between the seed layer 1420 and the channel layer 1410, or the thickness of the defect layer between the seed layer 1420 and the channel layer 1410 is small enough, no obvious undercut would be induced at the interface 111 during the wet etching process; and removing the photoresist pattern.

For example, for the same etchant, the ratio of the etching rate of the third semiconductor layer to the etching rate of the second semiconductor layer is in the range of 0.2 to 5. The same etchant is, for example, $HNO_3+CH_3COOH+H_3PO_4+H_2O$ etchant or $H_2SO_4+HNO_3+H_2O$ etchant.

Figure 2F:
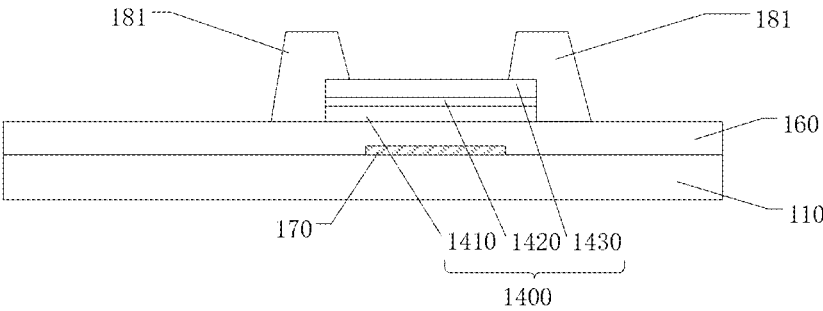
Figure 2G:
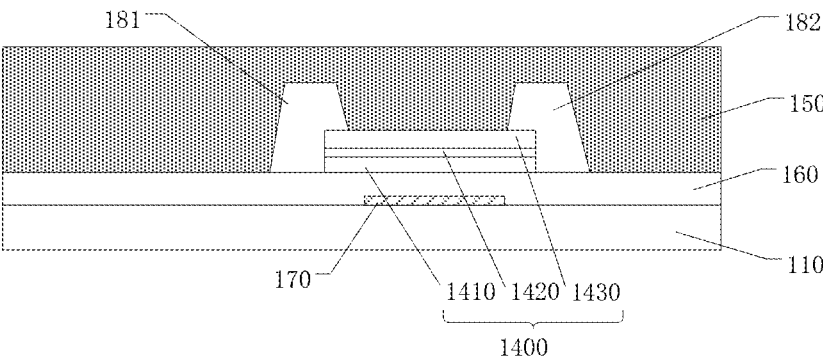

Referring to FIG. 2F and FIG. 2G, a source electrode 181 and a drain electrode 182 are formed on the base substrate 110 formed with the channel stack layer 1400; and a passivation layer 150 is formed on the base substrate 110 formed with the source electrode 181 and the drain electrode 182. The source electrode 181 and the drain electrode 182 are directly lapped on the channel stack layer 1400, for example. The source electrode 181 and the drain electrode 182 may include one or more of Au, Ag, Cu, Ni, Pt, Pd, Al, Mo, etc. The source electrode 181 and the drain electrode 182 may be single-layer metal or multi-layer metal.

Figure 2H:
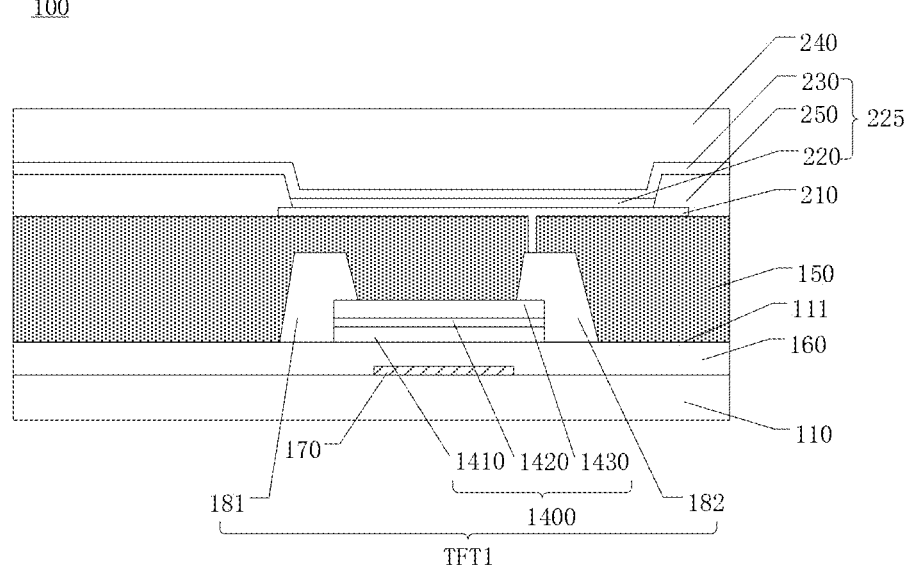

Referring to FIG. 2H, a light-emitting element and an encapsulation layer 240 are formed on the passivation layer 150.

In the present embodiment, the light-emitting element is an organic light emitting diode (OLED) 225. In addition, the light-emitting element may also be a quantum dot light-emitting diode (OLED) or the like, and the embodiments of the present disclosure is not limited thereto. For example, in some other embodiments, the semiconductor substrate may be an array substrate for a liquid crystal display device, or an electronic paper display device, at this time, it is not necessary to form a light-emitting element on the planarized layer of the semiconductor substrate; for example, in terms of a liquid crystal display device, a pixel electrode for controlling the deflection of the liquid crystal material is formed on the planarized layer of the semiconductor substrate, and a common electrode may further be formed at the same layer as the pixel electrode or at a different layer than that of the pixel electrode; in terms of an electronic paper display device, a pixel electrode and an electronic ink layer are formed on the planarized layer of the semiconductor substrate, and the pixel electrode is used for applying a voltage for driving the charged micro-particles in the electronic ink to move for display operation.

Taking the organic light-emitting diode as an example, the organic light-emitting diode includes a first driving electrode 210, a second driving electrode 230 and a light-emitting layer 220 between the first driving electrode 210 and the second driving electrode 230. The first driving electrode 210 is formed on the flat surface of the planarized layer 190, the light-emitting layer 220 is formed on the first driving electrode 210, and the second driving electrode 230 is formed on the light-emitting layer 220.

In addition, the semiconductor substrate 100 also includes a pixel defining layer 250 having an opening to define a light-emitting region, and the light-emitting layer 220 is formed in the opening. For example, the second driving electrode 230 may be a common electrode, which may be disposed on the whole or a part of the display region, covering a plurality of pixels, that is, shared by a plurality of pixels. When an appropriate voltage is applied between the first driving electrode 210 and the second driving electrode 230, one of the first driving electrode 210 and the second driving electrode 230 injects holes into the light-emitting layer 220, while the other one of the first driving electrode 210 and the second driving electrode 230 injects electrons into the light-emitting layer 220. Electrons and holes are re-combined with each other in the light-emitting layer 220 to produce excitons, and light is emitted through the energy generated when the excitons fall from the excited state to the ground state.

The encapsulation layer (or package layer) 240 covers the second driving electrode 230. The encapsulation layer 240 may seal the organic light-emitting diode, thereby reducing or avoiding the degradation of the organic light-emitting diode caused by moisture and/or oxygen included in the environment. For example, the encapsulation layer 240 may include a stacked structure including an inorganic layer and an organic layer.

It can be understood that, in the present embodiment, the thin film transistor TFT1 on the base substrate includes a gate electrode 170, a channel stack layer 1400, a source electrode 181 and a drain electrode 182.

In an example, the band gap Eg1 of the channel layer 1410, the band gap Eg2 of the seed layer 1420 and the band gap Eg3 of the channel layer 1430 satisfy the following requirement: $Eg1<Eg2\leq Eg3$; the conduction band bottom energy level Ec1 of the channel layer 1410, the conduction band bottom energy level Ec2 of the seed layer 1420 and the conduction band bottom energy level Ec3 of the channel layer 1430 satisfy the following requirement: $|Ec1|>|Ec2|\geq|Ec3|$; the valence band top energy level Ev1 of the channel layer 1410, the valence band top energy level Ev2 of the seed layer 1420 and the valence band top energy level Ev3 of the channel layer 1430 satisfy the following requirement: $|Ev1|<|Ev2|\leq|Ev3|$. Referring to FIG. 2H, the thin film transistor TFT1 has a bottom gate structure, and the channel layer 1410 is located between the gate electrode 170 and the channel layer 1430. In this case, the band gap of the channel layer 1410 is the smallest, and the energy band structure thereof is located below the seed layer 1420 and the channel layer 1430. During the operation of the thin film transistor, due to the band gap difference, the carriers generated by the channel layer 1410 (as a material with high carrier concentration) needs to cross the barrier of the band gap difference between the seed layer 1420 and channel layer 1430 before they can transition to other film layers. Therefore, the vast majority of carriers are confined in the channel layer 1410. The function of using the seed layer 1420 is, on the one hand, for removing the defect layer and then eliminate the issue of undercut, and on the other hand, reducing the internal interface defects and improving the stability of the device; at the same time, as a crystalline material, the seed layer 1420 is more matched with the channel layer 1430, and the interface defects are lower; the function of the channel layer 1430 lies in that: on the one hand, the high crystallinity of the channel layer 1430 can block the etching damage from source and drain etchant, reduce the bombardment of passivation layer deposition, prevent the diffusion of source and drain electrode elements, prevent the diffusion of elements, such as oxygen, etc., on the other hand, the large band gap of the channel layer 1430 can ensure that minimum limited carriers diffuse from the channel layer 1410 to the channel layer 1430, so as to reduce carrier loss; therefore, in the semiconductor substrate manufactured according to the embodiments of the present disclosure, the carrier mobility and stability of the thin film transistor are effectively improved.

Figure 5A:
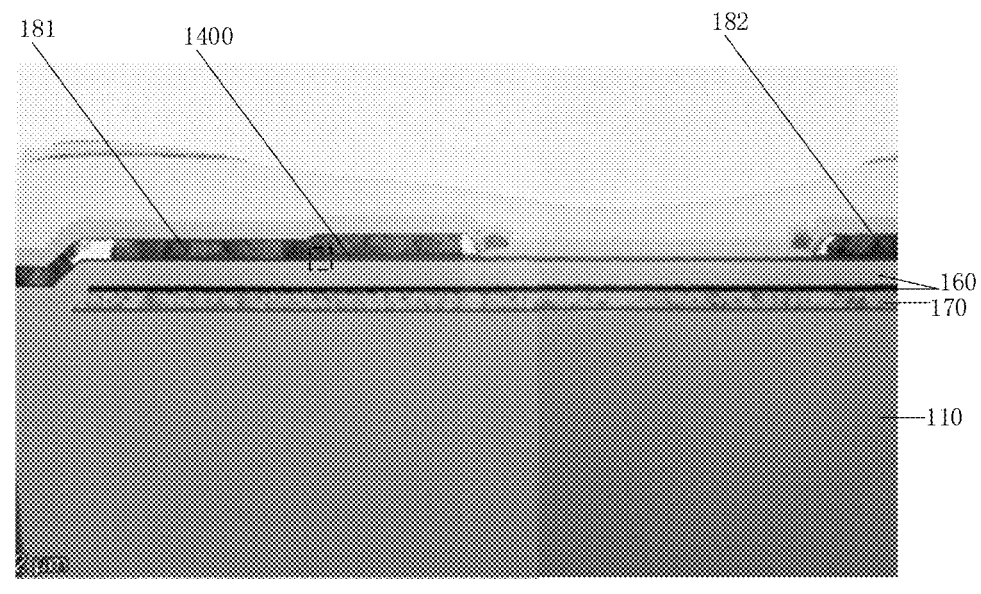
FIG. 5A illustrates a scanning electron micrograph of a thin film transistor in a semiconductor substrate according to an embodiment of the present disclosure.
Figure 5B:
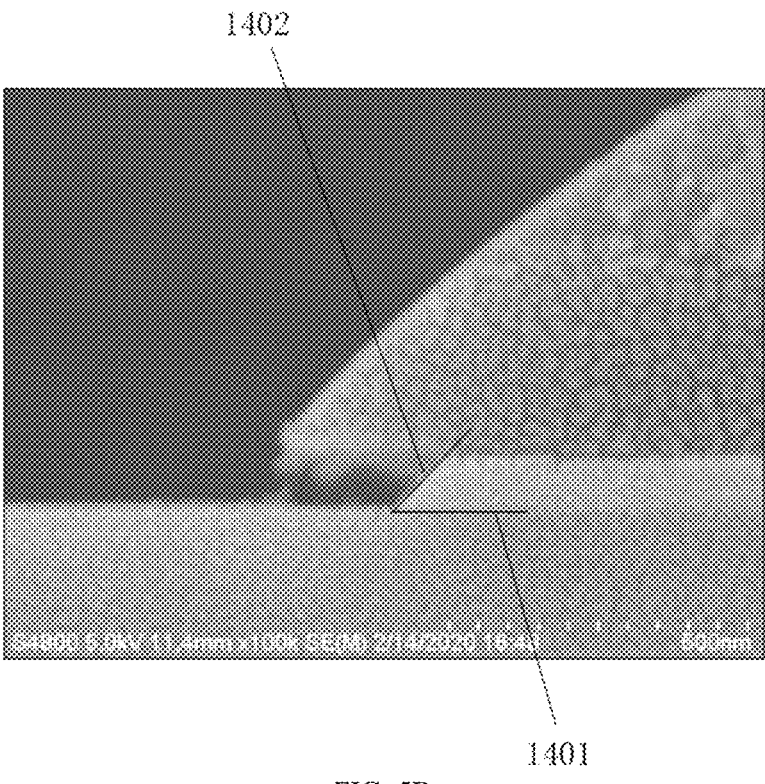
FIG. 5B illustrates a scanning electron micrograph of a channel stack layer of a thin film transistor in the semiconductor substrate, when the channel stack layer is formed using a first etchant and the photoresist thereon has not been removed, according to an embodiment of the present disclosure.
Figure 5C:
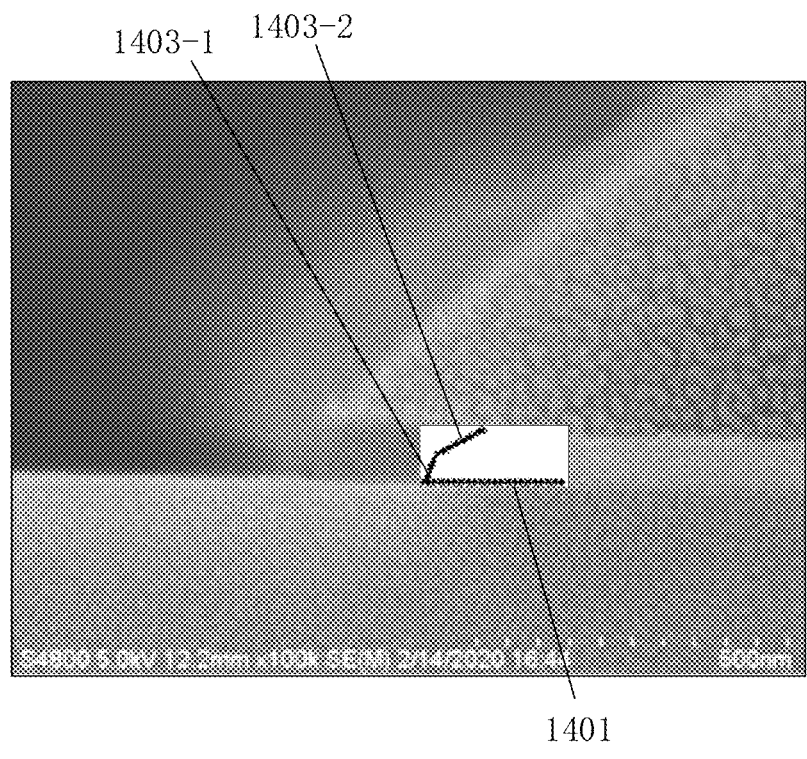
FIG. 5C illustrates a scanning electron micrograph of a channel stack layer of a thin film transistor in the semiconductor substrate, when the channel stack layer is formed using a second etchant and the photoresist thereon has not been removed, according to an embodiment of the present disclosure.

FIG. 5A illustrates a scanning electron micrograph of a thin film transistor in a semiconductor substrate according to an embodiment of the present disclosure; FIG. 5B illustrates a scanning electron micrograph of the channel stack layer of the thin film transistor in the semiconductor substrate when the channel stack layer is formed using a first etchant and the photoresist thereon has not been removed, according to an embodiment of the disclosure; FIG. 5C illustrates a scanning electron micrograph of the channel stack layer of the thin film transistor in the semiconductor substrate when the channel stack layer is formed using a second etchant and the photoresist thereon has not been removed, according to an embodiment of the disclosure.

The scanning electron micrograph of FIG. 5A corresponds to the thin film transistor in the semiconductor substrate shown in FIG. 2H. The gate electrode 170 is located on the upper surface of the base substrate 110. The gate insulating layer 160 is located on the gate electrode 170. The channel stack layer 1400 is located on the gate insulating layer 160, and the source electrode 181 and the drain electrode 182 are lapped at two ends of the channel stack layer 1400.

The structure at the lapping position of the channel stack layer 1400 and the source electrode 181 can be clearly seen from FIG. 5B. Referring to FIG. 5B, the channel stack layer 1400 has a bottom surface 1401 facing the base substrate 110 and a side surface 1402, and the plane where the side surface 1402 is located intersects the plane where the bottom surface 1401 is located. Both the bottom surface 1401 and the side surface 1402 are planar surfaces. The first included angle between the bottom surface 1402 and the side surface 1401 is 20° to 70°. For example, the first included angle is preferably 45°. The channel stack layer 1400 shown in FIG. 5B is formed by etching with a first etchant, the composition of the first etchant is, for example, $HNO_3+CH_3COOH+H_3PO_4+H_2O$.

In another example, if the channel stack layer 1400 is formed by etching with a second etchant, the composition of the second etchant is, for example, $H_2SO_4+HNO_3+H_2O$, then the channel stack layer 1400 will be formed into the shape shown in FIG. 5C.

Referring to FIG. 5C, the channel stack layer 1400 has a bottom surface 1401 facing the base substrate 110 and a side surface 1403 intersecting the bottom surface 1401. The side surface 1403 includes a first sub-side surface 1403-1 and a second sub-side surface 1403-2. The plane where the first sub-side surface 1403-1 is located intersects the plane where the bottom surface 1401 is located. The plane where the second sub-side surface 1403-2 is located intersects the plane where the first sub-side surface 1403-1 is located and the plane where the bottom surface 1401 is located. The bottom surface 1401, the first sub-side surface 1403-1 and the second sub-side surface 1403-2 are, for example, planar surfaces. The second included angle between the bottom surface 1401 and the first sub-side surface 1403-1 is 50° to 80°. The third included angle between the second sub-side surface 1403-2 and the bottom surface 1401 is 20° to 70°. The second included angle is different from the third included angle. Here, the first included angle, the second included angle and the third included angle may be understood as the angle of slope of the channel stack layer.

Figure 5D:
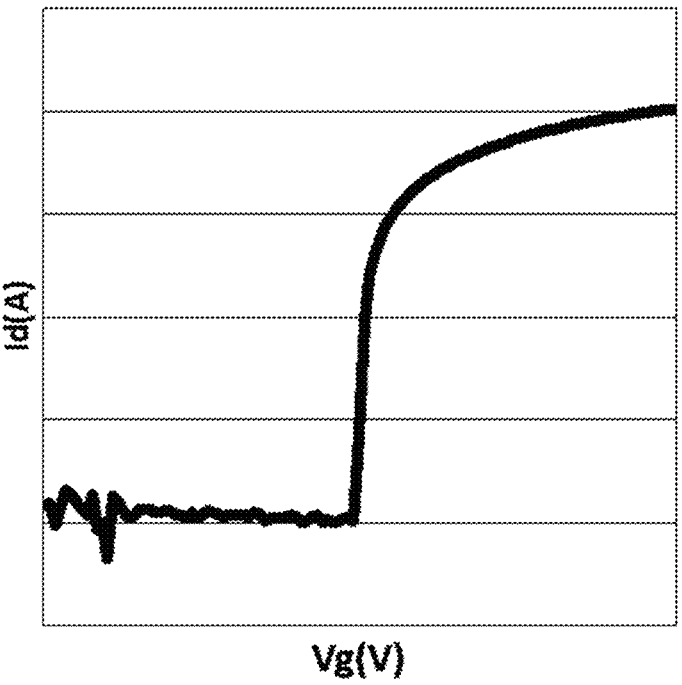
FIG. 5D illustrates an I-V characteristic testing result of a thin film transistor in the embodiments of the present disclosure.

FIG. 5D illustrates the I-V characteristic test result of the thin film transistor in the embodiments of the present disclosure. As can be seen from FIG. 5D, the I-V characteristic of the thin film transistor in the off-state of this embodiment almost has no fluctuation. Compared with the situation in the related art (see FIG. 7C), the electrical performance of the thin film transistor TFT1 in the present embodiment is significantly improved.

As can be seen from FIG. 5A to FIG. 5D, in the thin film transistor according to the embodiments of the present disclosure, due to a seed layer deposited at a relative high temperature being existed at a position very close to the deposition interface, the side surface of the channel stack layer is substantially a planar surface, and the angle of slope is also within the above favorable angle range, such that the stack-layer channel has a more uniform structure, and the thin film transistor has a more stable electrical performance.

It can be understood that, the number of sub-layers included in the semiconductor layer 141 (channel layer 1410) is not limited by the embodiments of the disclosure.

Figure 6A:
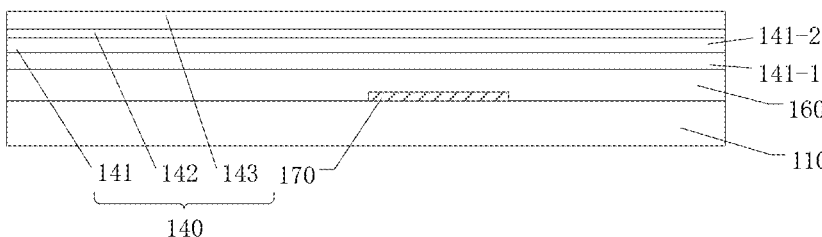
FIG. 6A and FIG. 6B respectively illustrate a structural schematic view of a semiconductor substrate formed with a semiconductor stack layer and a channel stack layer according to an example of embodiments of the present disclosure.
Figure 6B:
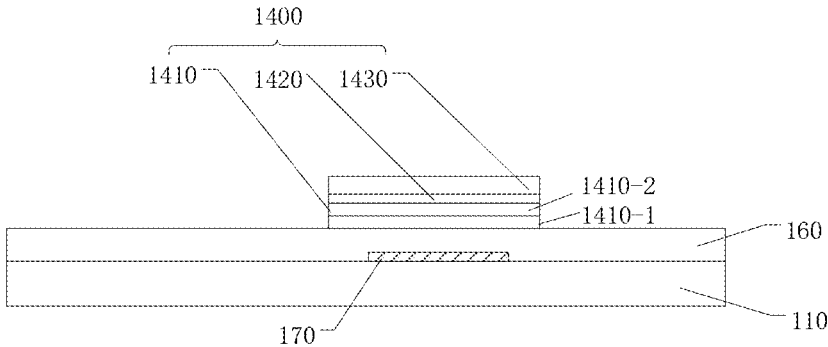

FIG. 6A and FIG. 6B respectively illustrate the structural schematic views of a semiconductor substrate formed with a semiconductor stack layer and a channel stack layer according to an example of embodiments of the present disclosure; the manufacturing steps of FIG. 6A and FIG. 6B may respectively correspond to FIG. 2D and FIG. 2E. Referring to FIGS. 6A and 6B, in this example, the semiconductor layer 141 includes a first semiconductor sublayer 141-1 and a second semiconductor sublayer 141-2. Accordingly, the channel layer 1410 includes a first channel sublayer 1410-1 and a second channel sublayer 1410-2. The first semiconductor sublayer 141-1 is located between the second semiconductor sublayer 141-2 and the gate electrode 170. The first channel sublayer 1410-1 is located between the second channel sublayer 1410-2 and the gate electrode 170. The first semiconductor sublayer 141-1 and the first channel sublayer 1410-1 are amorphous phase layers, while the second semiconductor sublayer 141-2 and the second channel sublayer 1410-2 are crystalline phase layers. In this case, for example, the surface of the second semiconductor sublayer 141-2 away from the base substrate 110 is the deposition interface 111 of the semiconductor layer 142; that is, the surface of the second channel sublayer 1410-2 away from the base substrate 110 is the deposition interface 111 of the seed layer 1420.

Figure 6C:
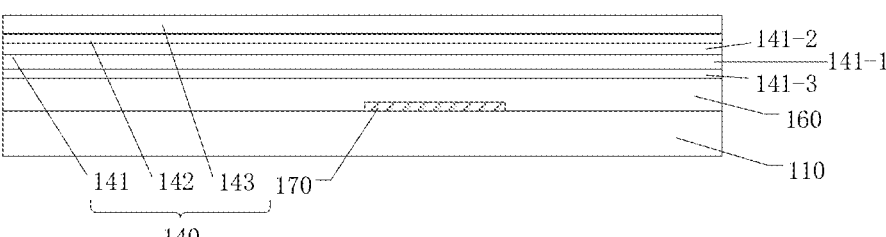
FIG. 6C and FIG. 6D respectively illustrate a structural schematic view of a semiconductor substrate formed with a semiconductor stack layer and a channel stack layer according to another example of embodiments of the present disclosure.
Figure 6D:
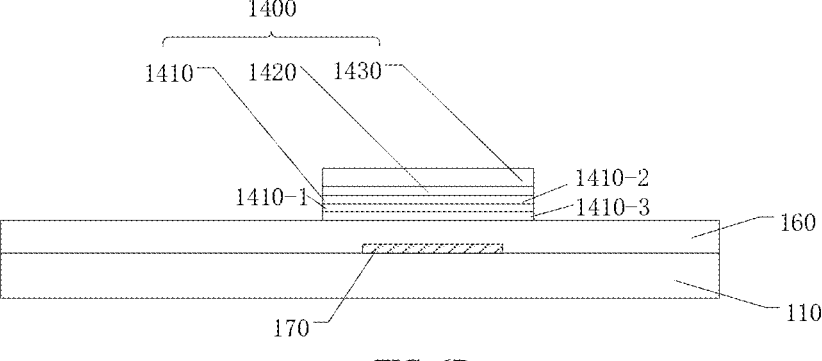

FIG. 6C and FIG. 6D respectively illustrate a structural schematic view of a semiconductor substrate formed with a semiconductor stack layer and a channel stack layer according to another example of the embodiments of the present disclosure. The manufacturing steps of FIG. 6C and FIG. 6D may respectively correspond to FIG. 2D and FIG. 2E. Referring to FIG. 6C and FIG. 6D, in this example, the semiconductor layer 141 includes a first semiconductor sublayer 141-1, a second semiconductor sublayer 141-2, and a third semiconductor sublayer 141-3. Accordingly, the channel layer 1410 includes a first channel sublayer 1410-1, a second channel sublayer 1410-2 and a third channel sublayer 1410-3. The first semiconductor sublayer 141-1 is located between the second semiconductor sublayer 141-2 and the gate electrode 170, the third semiconductor sublayer 141-3 is located between the first semiconductor sublayer 141-1 and the gate electrode 170. Accordingly, the first channel sublayer 1410-1 is located between the second channel sublayer 1410-2 and the gate electrode 170, the third channel sublayer 1410-3 is located between the first channel sublayer 1410-1 and the gate electrode 170. The first semiconductor sublayer 141-1 and the first channel sublayer 1410-1 are amorphous phase layers, the second semiconductor sublayer 141-2 and the second channel sublayer 1410-2 are crystalline phase layers, the third semiconductor sublayer 141-3 and the third channel sublayer 1410-3 are crystalline phase layers. In this case, for example, the surface of the second semiconductor sublayer 141-2 away from the base substrate 110 is the interface 111 for subsequent deposition of the semiconductor layer 142; that is, the surface of the second channel sublayer 1410-2 away from the base substrate 110 is the deposition interface 111 of the seed layer 1420.

FIG. 7A to FIG. 7H illustrate schematic views of the substrate structures corresponding to the respective steps in the manufacturing method of the semiconductor substrate 200 according to another embodiment of the present disclosure.

Figure 7A:
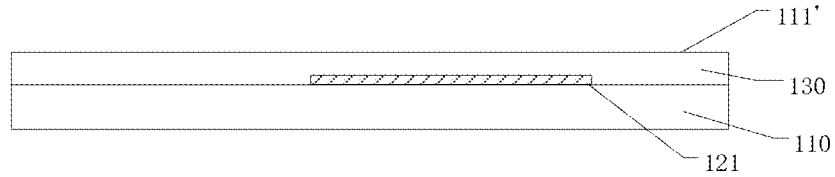
FIG. 7A to FIG. 7H illustrate schematic views of substrate structures corresponding to the respective steps in the manufacturing method of the semiconductor substrate according to another embodiment of the present disclosure.

Referring to FIG. 7A, a base substrate 110 is provided, and a light shielding part 121 and a buffer layer 130 are formed on the base substrate 110. The base substrate 110 may be a rigid substrate or a flexible substrate. For example, the material of the base substrate 110 may be glass, polyimide, polycarbonate, polyethylene, polyacrylate, polyethylene terephthalate, etc. The light shielding part 121 may include one or more of Au, Ag, Cu, Ni, Pt, Pd, Al, Mo, etc. The light shielding part 121 may be a single metal layer or a plurality of metal layers (metal stack layer). The buffer layer 130 may be formed as a single layer of silicon nitride (SiNx) or silicon oxide (SiO$_2$) or a stacked layer of silicon nitride (SiNx) and silicon oxide (SiO$_2$).

Figure 7B:
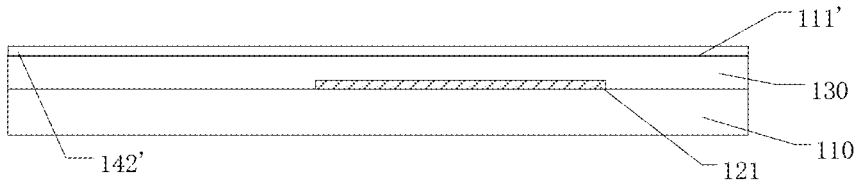
Figure 7C:
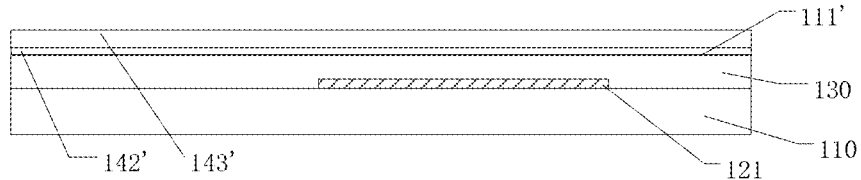
Figure 7D:
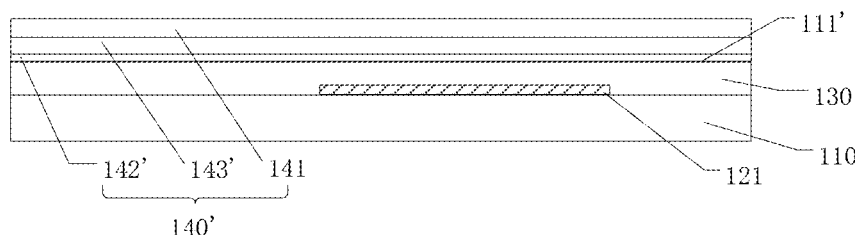

Referring to FIG. 7B to FIG. 7D, a semiconductor stack layer 140' is formed on the buffer layer 130 using a physical vapor deposition process, such as a sputtering process. The semiconductor stack layer 140 includes a semiconductor layer 141', a semiconductor layer 142', and a semiconductor layer 143'.

Referring to FIG. 7B, a semiconductor layer 142' of crystalline phase is deposited on the upper surface (interface) 111' of the buffer layer 130 away from the base substrate 110 at a higher first temperature. The upper surface 111' is the interface between the buffer layer 130 and the atmosphere in the deposition chamber before forming the semiconductor layer 142'; and the upper surface 111' is the interface between the buffer layer 130 and the semiconductor layer 142' after forming the semiconductor layer 142'. The first temperature is greater than or equal to 100° C. Preferably, the first temperature is greater than or equal to 120° C.

The semiconductor layer 142' in the present embodiment corresponds to and the same as the semiconductor layer 142 in the previous embodiment in terms of material, thickness, crystallinity and forming process, and therefore, the repeated description is omitted here. Herein, the semiconductor layer 142' in the present embodiment and the semiconductor layer 142 in the above embodiment may correspond to the first semiconductor layer.

Referring to FIG. 7C, a semiconductor layer 143' is deposited on the upper surface of the semiconductor layer 142' away from the base substrate 110. The semiconductor layer 143' in the present embodiment corresponds to the semiconductor layer 143 in the previous embodiment in terms of material, crystallinity, thickness and forming process, and therefore, the repeated description is omitted here. Herein, the semiconductor layer 143' in the present embodiment and the semiconductor layer 143 in the above embodiment may correspond to the second semiconductor layer.

In the present embodiment, the semiconductor layer 142' deposited at a higher temperature may directly form a crystalline phase layer on the surface (interface) 111'; so as to replace the defect layer existed on the interface when the semiconductor layer 142' is deposited at room temperature, such that no obvious undercut will be induced in the subsequent patterning process.

Referring to FIG. 7D, a semiconductor layer 141' is deposited on the upper surface of the semiconductor layer 143' away from the base substrate 110. The semiconductor layer 141' in the present embodiment corresponds to the semiconductor layer 141 in the previous embodiment in terms of material, thickness, crystallinity, sublayer, forming process, etc., therefore, the repeated description is omitted here. Herein, the semiconductor layer 141' in the present embodiment and the semiconductor layer 141 in the above embodiment may correspond to the third semiconductor layer.

In the embodiments of the present disclosure, since the semiconductor layer 143' has a good crystallinity and the semiconductor layer 141' deposited thereon is in an amorphous phase state, although the materials of the semiconductor layer 143' and the semiconductor layer 141' are different, there is no need to form a structural layer similar to the seed layer described above. Of course, the embodiments of the present disclosure are not limited thereto.

Figure 7E:
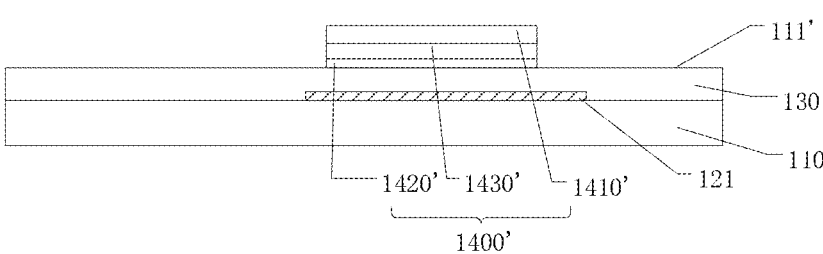

Referring to FIG. 7E, a patterning process is performed on the semiconductor stack layer 140' to form a channel stack layer 1400'. The channel stack layer 1400' includes a channel layer 1410', a seed layer 1420', and a channel layer 1430'. The channel layer 1410', the seed layer 1420', and the channel layer 1430' are parts of the semiconductor layer 141', the semiconductor layer 142' and the semiconductor layer 143', respectively. Here, the channel layer 1430' in the present embodiment and the channel layer 1430 in the previous embodiment may correspond to the first channel layer, and the channel layer 1410' in the present embodiment and the channel layer 1410 in the previous embodiment may correspond to the second channel layer.

Here, the patterning process performed on the semiconductor stack layer 140' is similar to the patterning process performed on the semiconductor stack 140 in the previous embodiment, and are not described again here.

Figure 7F:
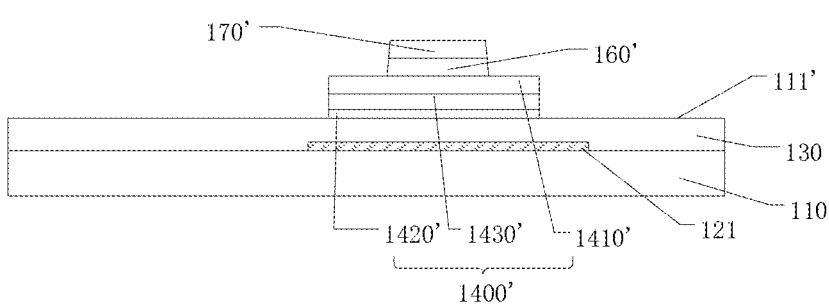

Referring to FIG. 7F, a gate electrode 170' and a gate insulating layer 160' are formed on the base substrate 110 formed with the channel stack layer 1400'.

Figure 7G:
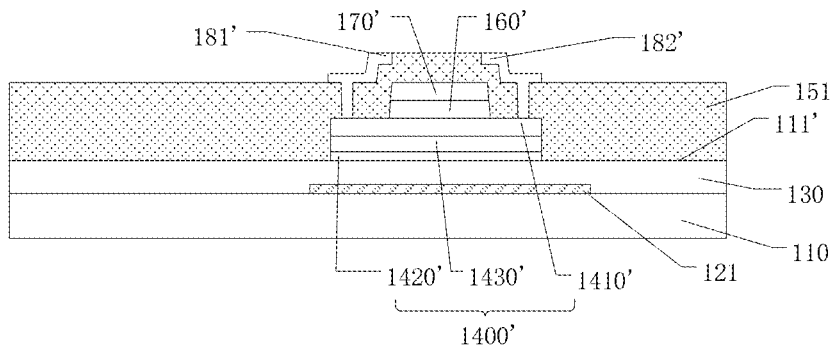

Referring to FIG. 7G, an intermediate dielectric layer 151 is formed on the base substrate 110 formed with the gate electrode 170' and the gate insulating layer 160'; a source electrode 181' and a drain electrode 182' are formed on the intermediate dielectric layer 151; the source electrode 181' and the drain electrode 182' are electrically connected to the channel stack layer 1400' through vias in the intermediate dielectric layer 150.

Figure 7H:
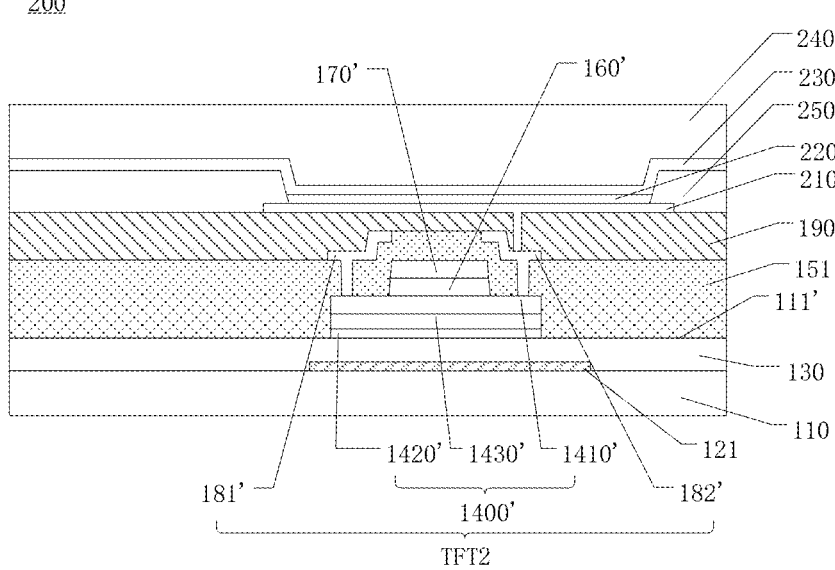

Referring to FIG. 7H, a planarized layer 190 is formed on the base substrate 110 formed with the source electrode 181' and the drain electrode 182'. A light-emitting element 225 and an encapsulation layer 240 are formed on the planarized layer 190.

In one example, the band gap Eg1 of the channel layer 1410', the band gap Eg2 of the seed layer 1420', and the band gap Eg3 of the channel layer 1430' satisfy the following requirement: Eg1<Eg2≤Eg3; the conduction band bottom energy level Ec1 of the channel layer 1410', the conduction band bottom energy level Ec2' of the seed layer 1420' and the conduction band bottom energy level Ec3 of the channel layer 1430 satisfy the following requirement: |Ec1|>|Ec2|≥|Ec3|; the valence band top energy level Ev1 of the channel layer 1410', the valence band top energy level Ev2 of the seed layer 1420', and the valence band top energy level Ev3 of the channel layer 1430' satisfy the following requirement: |Ev1|<|Ev2|≤|Ev3|. Referring to FIG. 7H, the thin film transistor TFT2 has a top gate structure, and the channel layer 1410' (second channel layer) is located between the gate electrode 170' and the channel layer 1430' (first channel layer). In this case, the band gap of the channel layer 1410' is the smallest, and the energy band structure thereof is located below the seed layer 1420' and the channel layer 1430'. During the operation of the thin film transistor, due to the band gap difference, the carriers generated by the channel layer 1410' (as a material with high carrier concentration) need to cross the barrier of the band gap difference between the seed layer 1420' and the channel layer 1430' before they can transition to other film layers. Therefore, the vast majority of carriers are confined in the channel layer 1410'. The function of using the seed layer 1420' is, on the one hand, for removing the defect layer and then eliminate the issue of undercut, and on the other hand, reducing the internal interface defects and improving the stability of the device; at the same time, as a crystalline material, the seed layer 1420' is more matched with the channel layer 1430', and the interface defects are lower; the function of the channel layer 1430' lies in that: on the one hand, the high crystallinity of the channel layer 1430' can block the etching damage from source and drain etchant, reduce the bombardment of passivation layer deposition, prevent the diffusion of source and drain electrode elements, prevent the diffusion of elements, such as oxygen, etc., on the other hand, the large band gap of the channel layer 1430' can ensure that minimum limited carriers diffuse from the channel layer 1410' to the channel layer 1430', so as to reduce carrier loss; therefore, in the semiconductor substrate manufactured according to the embodiments of the present disclosure, the carrier mobility and stability of the thin film transistor are effectively improved.

In the above embodiment, the semiconductor substrate serving as an active array substrate of a display device is illustrated taking an oxide semiconductor thin film transistor and the corresponding pixel structure on the semiconductor substrate as an example. In the active array substrate of another embodiment of the present disclosure, the oxide semiconductor thin film transistor can be used not only as a switching element disposed for each pixel, but also as a circuit element (monolithic) of peripheral circuit, such as a driver.

The embodiments of the present disclosure may be widely applied to various semiconductor devices with oxide semiconductor thin film transistors. For example, it may be applied to various electronic devices, such circuit substrates (e.g., active array substrates), liquid crystal display devices, organic electroluminescent (EL) display devices and inorganic electroluminescent display devices, display devices (e.g., MEMS display devices), imaging devices (e.g., image sensor devices), image input devices, fingerprint reading devices, semiconductor memories, etc.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

Although the present disclosure has been described in detail with general description and specific embodiments above, it is obvious to those skilled in the art that some modifications or improvements can be made on the basis of the embodiments of the present disclosure. Therefore, these modifications or improvements made on the basis of not deviating from the spirit of the present disclosure belong to the scope of protection claimed in the present disclosure.

The invention claimed is:

1. A manufacturing method of a semiconductor substrate, comprising:

providing a base substrate;

forming a semiconductor stack layer comprising a first semiconductor layer, a second semiconductor layer and a third semiconductor layer on the base substrate by a physical vapor deposition process, comprising:

forming the first semiconductor layer on the base substrate with the base substrate at a first temperature, wherein a material of the first semiconductor layer is a first oxide semiconductor material;

forming the second semiconductor layer directly on the first semiconductor layer, wherein a material of the second semiconductor layer is a second oxide semiconductor material; and forming the third semiconductor layer, wherein a material of the third semiconductor layer is a third oxide semiconductor material;

performing a patterning process on the semiconductor stack layer, such that the first semiconductor layer, the second semiconductor layer and the third semiconductor layer are respectively patterned into a seed layer, a first channel layer and a second channel layer, wherein the seed layer, the first channel layer and the second channel layer constitute a channel stack layer;

forming a gate electrode and a gate insulating layer on the base substrate; and forming a source electrode and a drain electrode on the base substrate formed with the channel stack layer, wherein the source electrode and the drain electrode are electrically connected to the channel stack layer, wherein the second channel layer is located between the gate electrode and the first channel layer, the first oxide semiconductor material is different from the third oxide semiconductor material, and the first channel layer and the seed layer are crystalline phase layers, wherein both the first oxide semiconductor material and the second oxide semiconductor material are capable of forming crystalline phases at a second temperature, the second temperature is less than or equal to 40° C., and the first temperature is greater than or equal to 100° C., wherein the first oxide semiconductor material of the first semiconductor layer is the same as the second oxide semiconductor material of the second semiconductor layer, and the second semiconductor layer is formed at the second temperature, wherein a thickness of the second semiconductor layer is four to eight times of a thickness of the first semiconductor layer, wherein both the first semiconductor layer and the second semiconductor layer are formed as crystalline phases.

2. The manufacturing method according to claim 1, wherein the gate electrode is located between the channel stack layer and the base substrate, and the first semiconductor layer is formed on a surface of the third semiconductor layer away from the base substrate.

3. The manufacturing method according to claim 1, further comprising: forming an insulating layer on the base substrate, wherein the insulating layer is located between the first semiconductor layer and the base substrate, the channel stack layer is located between the gate electrode and the base substrate, and the first semiconductor layer is formed on a surface of the insulating layer away from the base substrate.

4. The manufacturing method according to claim 1, wherein the channel stack layer has a bottom surface facing the base substrate and a side surface, both the bottom surface and the side surface are planar surfaces, and a first included angle between the bottom surface and the side surface is 20° to 70°.

5. The manufacturing method according to claim 1, wherein the channel stack layer has a bottom surface facing the base substrate and a side surface, the side surface comprises a first sub-side surface and a second sub-side surface, all of the bottom surface, the first sub-side surface and the second sub-side surface are planar surfaces, a second included angle between the bottom surface and the first sub-side surface is 50° to 80°, a third included angle between the second sub-side surface and the bottom surface is 20° to 70°, and the second included angle is different from the third included angle.

6. The manufacturing method according to claim 1, wherein the third semiconductor layer is an amorphous phase layer.

7. The manufacturing method according to claim 1, wherein an electron mobility of the third semiconductor layer is greater than electron mobilities of the first semiconductor layer and the second semiconductor layer.

8. The manufacturing method according to claim 1, wherein a band gap Eg1 of the second channel layer, a band gap Eg2 of the seed layer and a band gap Eg3 of the first channel layer satisfy: Eg1<Eg2≤Eg3;

a conduction band bottom energy level Ec1 of the second channel layer, a conduction band bottom energy level Ec2 of the seed layer and a conduction band bottom energy level Ec3 of the first channel layer satisfy: |Ec1|>|Ec2|≥|Ec3|; and a valence band top energy level Ev1 of the second channel layer, a valence band top energy level Ev2 of the seed layer and a valence band top energy level Ev3 of the first channel layer satisfy: |Ev1|<|Ev2|≤|Ev3|.

9. The manufacturing method according to claim 1, wherein a thickness of the seed layer is 50 angstroms to 100 angstroms.

10. The manufacturing method according to claim 1, wherein the first temperature is greater than 120° C.

11. The manufacturing method according to claim 1, wherein each of the first oxide semiconductor material and the second oxide semiconductor material comprises two or more metal elements selected from the group consisting of In, Ga, Zn and Sn.

12. The manufacturing method according to claim 11, wherein each of the first oxide semiconductor material and the second oxide semiconductor material is IGZO material, wherein a ratio of an atomic number of In to a sum of atomic numbers of In, Ga and Zn is 7%-14%; a ratio of an atomic number of Ga to a sum of atomic numbers of In, Ga and Zn is 20%-40%; and a ratio of an atomic number of Zn to a sum of atomic numbers of In, Ga and Zn is 50%-70%.

13. The manufacturing method according to claim 11, wherein each of the first oxide semiconductor material and the second oxide semiconductor material is IGZO material, wherein a ratio of an atomic number of In to a sum of atomic numbers of In, Ga and Zn is 35%-50%; a ratio of an atomic number of Ga to a sum of atomic numbers of In, Ga and Zn is 10%-40%; and a ratio of an atomic number of Zn to a sum of atomic numbers of In, Ga and Zn is 20%-40%.

14. The manufacturing method according to claim 1, wherein the third semiconductor layer comprises a first semiconductor sublayer and a second semiconductor sublayer, the first semiconductor sublayer is between the gate electrode and the second semiconductor sublayer, the first semiconductor sublayer is a crystalline phase layer, and the second semiconductor sublayer is an amorphous phase layer, the gate electrode is located between the channel stack layer and the base substrate, and the first semiconductor layer is formed on a surface of the second semiconductor sublayer away from the base substrate.

15. The manufacturing method according to claim 14, wherein the third semiconductor layer further comprises a third semiconductor sublayer, the third semiconductor sublayer is located between the gate electrode and the first semiconductor sublayer, and the third semiconductor layer is a crystalline phase layer.

16. The manufacturing method according to claim 1, wherein for a same etchant, a ratio of an etching rate of the third semiconductor layer to an etching rate of the second semiconductor layer is in a range of 0.2 to 5.

* * * * *